(12) United States Patent
Miyoshi et al.

(10) Patent No.: US 8,471,265 B2
(45) Date of Patent: Jun. 25, 2013

(54) EPITAXIAL SUBSTRATE WITH INTERMEDIATE LAYERS FOR REINFORCING COMPRESSIVE STRAIN IN LAMINATED COMPOSITION LAYERS AND MANUFACTURING METHOD THEREOF

(75) Inventors: Makoto Miyoshi, Inazawa (JP); Shigeaki Sumiya, Handa (JP); Mikiya Ichimura, Ichinomiya (JP); Sota Maehara, Nagoya (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/414,104

(22) Filed: Mar. 7, 2012

(65) Prior Publication Data

US 2012/0161152 A1      Jun. 28, 2012

Related U.S. Application Data

(63) Continuation of application No. PCT/JP2010/071582, filed on Dec. 2, 2010.

(30) Foreign Application Priority Data

Feb. 16, 2010 (JP) ................................ 2010-031281
Jun. 8, 2010 (JP) ................................ 2010-131019

(51) Int. Cl.
*H01L 29/205*  (2006.01)
*H01L 21/20*   (2006.01)
*H01L 29/04*   (2006.01)

(52) U.S. Cl.
USPC .............................. 257/76; 257/190; 438/478

(58) Field of Classification Search
CPC ....... H01L 21/205; H01L 29/205; H01L 21/20; H01L 21/338; H01L 29/04; H01L 29/778; H01L 29/812; C23C 16/34; C30B 29/38
See application file for complete search history.

(56) References Cited

U.S. PATENT DOCUMENTS

| 6,255,004 | B1 | 7/2001 | Yoshida |
| 6,890,791 | B2 | 5/2005 | Ohtsuka et al. |

(Continued)

FOREIGN PATENT DOCUMENTS

| JP | 10-163528 A1 | 6/1998 |
| JP | 2004-349387 A1 | 12/2004 |

(Continued)

OTHER PUBLICATIONS

Toshihide Kikkawa, "*Highly Reliable 250W GaN High Electron Mobility Transistor Power Amplifier*," Japan Journal of Applied Physics, vol. 44, No. 7A, 2005, pp. 4896-4901.

(Continued)

*Primary Examiner* — Walter H Swanson
(74) *Attorney, Agent, or Firm* — Burr & Brown

(57) ABSTRACT

Provided is a crack-free epitaxial substrate having a small amount of warping, in which a silicon substrate is used as a base substrate. The epitaxial substrate includes a (111) single crystal Si substrate, a buffer layer, and a crystal layer. The buffer layer is formed of a first lamination unit and a second lamination unit being alternately laminated. The first lamination unit includes a composition modulation layer and a first intermediate layer. The composition modulation layer is formed of a first unit layer and a second unit layer having different compositions being alternately and repeatedly laminated so that a compressive strain exists therein. The first intermediate layer enhances the compressive strain existing in the composition modulation layer. The second lamination unit is a second intermediate layer that is substantially strain-free.

20 Claims, 7 Drawing Sheets

U.S. PATENT DOCUMENTS

| | | |
|---|---|---|
| 2009/0200645 A1 | 8/2009 | Kokawa et al. |
| 2011/0001127 A1* | 1/2011 | Sakamoto et al. ............. 257/22 |
| 2012/0223328 A1* | 9/2012 | Ikuta et al. .................... 257/76 |

FOREIGN PATENT DOCUMENTS

| | | | |
|---|---|---|---|
| JP | 2005-350321 | A1 | 12/2005 |
| JP | 2007-221001 | A1 | 8/2007 |
| JP | 2008-205117 | A1 | 9/2008 |
| JP | 2009-188252 | A1 | 8/2009 |
| JP | 2009-289956 | A1 | 12/2009 |

OTHER PUBLICATIONS

Nariaki Ikeda et al., *"High Power AlGaN/GaN HFET with a High Breakdown Voltage of Over 1.8kV on 4 inch Si Substrate and the Suppression of Current Collapse,"* Proceedings of the 20th International Symposium on Power Semiconductor Devices & IC's, May 18-22, 2008, Orlando, FL, pp. 287-290.

International Search Report dated Aug. 25, 2011.

International Preliminary Report on Patentability dated Sep. 18, 2012 (with English translation).

* cited by examiner

FIG. 4

| SPECIMEN No. | BUFFER LAYER | | | | | | EPITAXIAL FILM | EVALUATION RESULT | |
|---|---|---|---|---|---|---|---|---|---|
| | CONFIGURATION OF UNIT STRUCTURE | | | | SECOND INTERMEDIATE LAYER E [nm] | TOTAL THICKNESS [nm] | TOTAL FILM THICKNESS [$\mu$m] | OCCURRENCE OF CRACKING | WARPING [$\mu$m] |
| | COMPOSITION MODULATION LAYER | | FIRST INTERMEDIATE LAYER | | | | | | |
| | x | n | y | D [nm] | K | | | | |
| a-1 | 0 | 30 | 0 | 120 | 3 | 15 | 2205 | 3.07 | NOT OBSERVED | 73 |
| a-2 | 0 | 30 | 0 | 180 | 3 | 15 | 2385 | 3.25 | NOT OBSERVED | 58 |
| a-3 | 0 | 30 | 0 | 210 | 3 | 15 | 2475 | 3.34 | NOT OBSERVED | 56 |
| a-4 | 0 | 30 | 0 | 240 | 3 | 15 | 2565 | 3.43 | NOT OBSERVED | 54 |
| a-5 | 0 | 20 | 0 | 345 | 3 | 15 | 2280 | 3.15 | NOT OBSERVED | 62 |
| a-6 | 0 | 15 | 0 | 445 | 3 | 15 | 2280 | 3.15 | NOT OBSERVED | 58 |
| a-7 | 0 | 20 | 0 | 120 | 4 | 15 | 2145 | 3.01 | NOT OBSERVED | 73 |
| a-8 | 0 | 20 | 0 | 180 | 4 | 15 | 2385 | 3.25 | NOT OBSERVED | 57 |
| a-9 | 0 | 15 | 0 | 240 | 4 | 15 | 2225 | 3.09 | NOT OBSERVED | 52 |
| a-10 | 0 | 15 | 0 | 280 | 4 | 15 | 2385 | 3.25 | NOT OBSERVED | 53 |
| a-11 | 0 | 15 | 0 | 120 | 5 | 15 | 2185 | 3.05 | NOT OBSERVED | 65 |
| a-12 | 0 | 15 | 0 | 150 | 5 | 15 | 2335 | 3.20 | NOT OBSERVED | 60 |
| a-13 | 0 | 15 | 0 | 180 | 5 | 15 | 2485 | 3.35 | NOT OBSERVED | 54 |
| a-14 | 0 | 10 | 0 | 120 | 6 | 15 | 2025 | 2.89 | NOT OBSERVED | 71 |
| a-15 | 0 | 10 | 0 | 150 | 6 | 15 | 2205 | 3.07 | NOT OBSERVED | 62 |
| a-16 | 0 | 10 | 0 | 180 | 6 | 15 | 2385 | 3.25 | NOT OBSERVED | 54 |
| a-17 | 0 | 20 | 0 | 180 | 4 | 30 | 2430 | 3.30 | NOT OBSERVED | 45 |
| a-18 | 0 | 20 | 0 | 180 | 4 | 60 | 2520 | 3.39 | NOT OBSERVED | 27 |
| a-19 | 0 | 18 | 0 | 180 | 4 | 90 | 2450 | 3.32 | NOT OBSERVED | 23 |
| a-20 | 0 | 16 | 0 | 180 | 4 | 140 | 2440 | 3.31 | NOT OBSERVED | 18 |
| a-21 | 0 | 100 | 0 | 180 | 1 | 0 | 2185 | 3.05 | OBSERVED AT 20 mm FROM OUTER PERIPHERY | 126 |
| a-22 | 0 | 20 | 0 | 80 | 4 | 15 | 1985 | 2.85 | OBSERVED AT 20 mm FROM OUTER PERIPHERY | 115 |
| a-23 | 0 | 20 | 0 | 80 | 4 | 30 | 2030 | 2.90 | OBSERVED AT 20 mm FROM OUTER PERIPHERY | 120 |
| a-24 | 0 | 20 | 0 | 180 | 4 | 0 | 2340 | 3.21 | OBSERVED AT 20 mm FROM OUTER PERIPHERY | 135 |
| a-25 | 0 | 20 | 0 | 180 | 4 | 5 | 2355 | 3.22 | OBSERVED AT 20 mm FROM OUTER PERIPHERY | 125 |
| a-26 | 0 | 20 | 0 | 120 | 4 | 200 | 2700 | 3.57 | OBSERVED AT 20 mm FROM OUTER PERIPHERY | 126 |
| a-27 | 0 | 20 | 0 | 180 | 4 | 200 | 2940 | 3.81 | OBSERVED AT 20 mm FROM OUTER PERIPHERY | 136 |

FIG. 5

| SPECIMEN No. | BUFFER LAYER | | | | | | EPITAXIAL FILM | EVALUATION RESULT | | BREAKDOWN VOLTAGE (LEAKAGE CURRENT) 1mA/cm² [V] |
|---|---|---|---|---|---|---|---|---|---|---|
| | CONFIGURATION OF UNIT STRUCTURE | | | | SECOND INTERMEDIATE LAYER E [nm] | TOTAL THICKNESS [nm] | TOTAL FILM THICKNESS [μm] | OCCURRENCE OF CRACKING | WARPING [μm] | |
| | COMPOSITION MODULATION LAYER | FIRST INTERMEDIATE LAYER | | | | | | | | |
| | x | n | y | D [nm] | K | | | | | |
| a-7 | 0 | 20 | 0 | 120 | 4 | 15 | 2145 | 3.01 | NOT OBSERVED | 73 | 65 |
| a-8 | 0 | 20 | 0 | 180 | 4 | 15 | 2385 | 3.25 | NOT OBSERVED | 58 | 85 |
| a-9 | 0 | 15 | 0 | 240 | 4 | 15 | 2225 | 3.09 | NOT OBSERVED | 54 | 105 |
| b-1 | 0.1 | 20 | 0.1 | 120 | 4 | 15 | 2145 | 3.01 | NOT OBSERVED | 82 | 550 |
| b-2 | 0.1 | 20 | 0.1 | 180 | 4 | 15 | 2385 | 3.25 | NOT OBSERVED | 71 | 620 |
| b-3 | 0.1 | 15 | 0.1 | 240 | 4 | 15 | 2225 | 3.09 | NOT OBSERVED | 63 | 680 |
| b-4 | 0.1 | 18 | 0.1 | 240 | 4 | 30 | 2510 | 3.38 | NOT OBSERVED | 53 | 670 |
| b-5 | 0.1 | 20 | 0.1 | 240 | 4 | 30 | 2670 | 3.54 | NOT OBSERVED | 52 | 685 |
| b-6 | 0.15 | 20 | 0.15 | 120 | 4 | 15 | 2145 | 3.01 | NOT OBSERVED | 86 | 595 |
| b-7 | 0.15 | 20 | 0.15 | 150 | 4 | 15 | 2265 | 3.13 | NOT OBSERVED | 81 | 625 |
| b-8 | 0.15 | 20 | 0.15 | 180 | 4 | 15 | 2385 | 3.25 | NOT OBSERVED | 76 | 655 |
| b-9 | 0.15 | 15 | 0.15 | 240 | 4 | 15 | 2225 | 3.09 | NOT OBSERVED | 71 | 690 |
| b-10 | 0.15 | 20 | 0.15 | 180 | 4 | 20 | 2400 | 3.27 | NOT OBSERVED | 68 | 690 |
| b-11 | 0.15 | 18 | 0.15 | 240 | 4 | 30 | 2510 | 3.38 | NOT OBSERVED | 54 | 730 |
| b-12 | 0.2 | 20 | 0.2 | 120 | 4 | 15 | 2145 | 3.01 | NOT OBSERVED | 83 | 765 |
| b-13 | 0.2 | 20 | 0.2 | 150 | 4 | 15 | 2265 | 3.13 | NOT OBSERVED | 71 | 790 |
| b-14 | 0.2 | 20 | 0.2 | 180 | 4 | 15 | 2385 | 3.25 | NOT OBSERVED | 68 | 820 |
| b-15 | 0.2 | 15 | 0.2 | 240 | 4 | 15 | 2225 | 3.09 | NOT OBSERVED | 61 | 885 |
| b-16 | 0.2 | 18 | 0.2 | 210 | 4 | 30 | 2390 | 3.26 | NOT OBSERVED | 62 | 845 |
| b-17 | 0.2 | 18 | 0.2 | 240 | 4 | 30 | 2510 | 3.38 | NOT OBSERVED | 58 | 890 |
| b-18 | 0.2 | 18 | 0.2 | 280 | 4 | 30 | 2670 | 3.54 | NOT OBSERVED | 54 | 925 |
| b-19 | 0.2 | 20 | 0.2 | 180 | 4 | 60 | 2520 | 3.39 | NOT OBSERVED | 47 | 800 |
| b-20 | 0.2 | 20 | 0.2 | 180 | 4 | 90 | 2610 | 3.48 | NOT OBSERVED | 43 | 810 |
| b-21 | 0.2 | 20 | 0.2 | 180 | 4 | 100 | 2640 | 3.51 | NOT OBSERVED | 41 | 815 |
| b-22 | 0.2 | 30 | 0.2 | 120 | 3 | 15 | 2205 | 3.07 | NOT OBSERVED | 87 | 820 |
| b-23 | 0.2 | 30 | 0.2 | 180 | 3 | 15 | 2385 | 3.25 | NOT OBSERVED | 71 | 910 |
| b-24 | 0.2 | 30 | 0.2 | 210 | 3 | 15 | 2475 | 3.34 | NOT OBSERVED | 70 | 970 |
| b-25 | 0.2 | 24 | 0.2 | 240 | 3 | 30 | 2235 | 3.10 | NOT OBSERVED | 58 | 890 |
| b-26 | 0.2 | 20 | 0.2 | 345 | 3 | 30 | 2310 | 3.18 | NOT OBSERVED | 63 | 980 |
| b-27 | 0.2 | 15 | 0.2 | 445 | 3 | 30 | 2310 | 3.18 | NOT OBSERVED | 61 | 1020 |
| b-28 | 0.2 | 15 | 0.2 | 120 | 5 | 30 | 2245 | 3.11 | NOT OBSERVED | 67 | 700 |
| b-29 | 0.2 | 15 | 0.2 | 150 | 5 | 30 | 2395 | 3.26 | NOT OBSERVED | 65 | 755 |
| b-30 | 0.2 | 15 | 0.2 | 180 | 5 | 30 | 2545 | 3.41 | NOT OBSERVED | 61 | 820 |
| b-31 | 0.2 | 12 | 0.2 | 120 | 6 | 30 | 2340 | 3.21 | NOT OBSERVED | 75 | 660 |
| b-32 | 0.2 | 11 | 0.2 | 150 | 6 | 30 | 2400 | 3.27 | NOT OBSERVED | 67 | 715 |
| b-33 | 0.2 | 10 | 0.2 | 180 | 6 | 30 | 2460 | 3.33 | NOT OBSERVED | 59 | 760 |
| b-34 | 0.2 | 20 | 0.2 | 180 | 4 | 0 | 2340 | 3.21 | OBSERVED AT 20 mm FROM OUTER PERIPHERY | 125 | NOT EVALUATED |
| b-35 | 0.2 | 20 | 0.2 | 180 | 4 | 5 | 2355 | 3.22 | OBSERVED AT 20 mm FROM OUTER PERIPHERY | 115 | NOT EVALUATED |

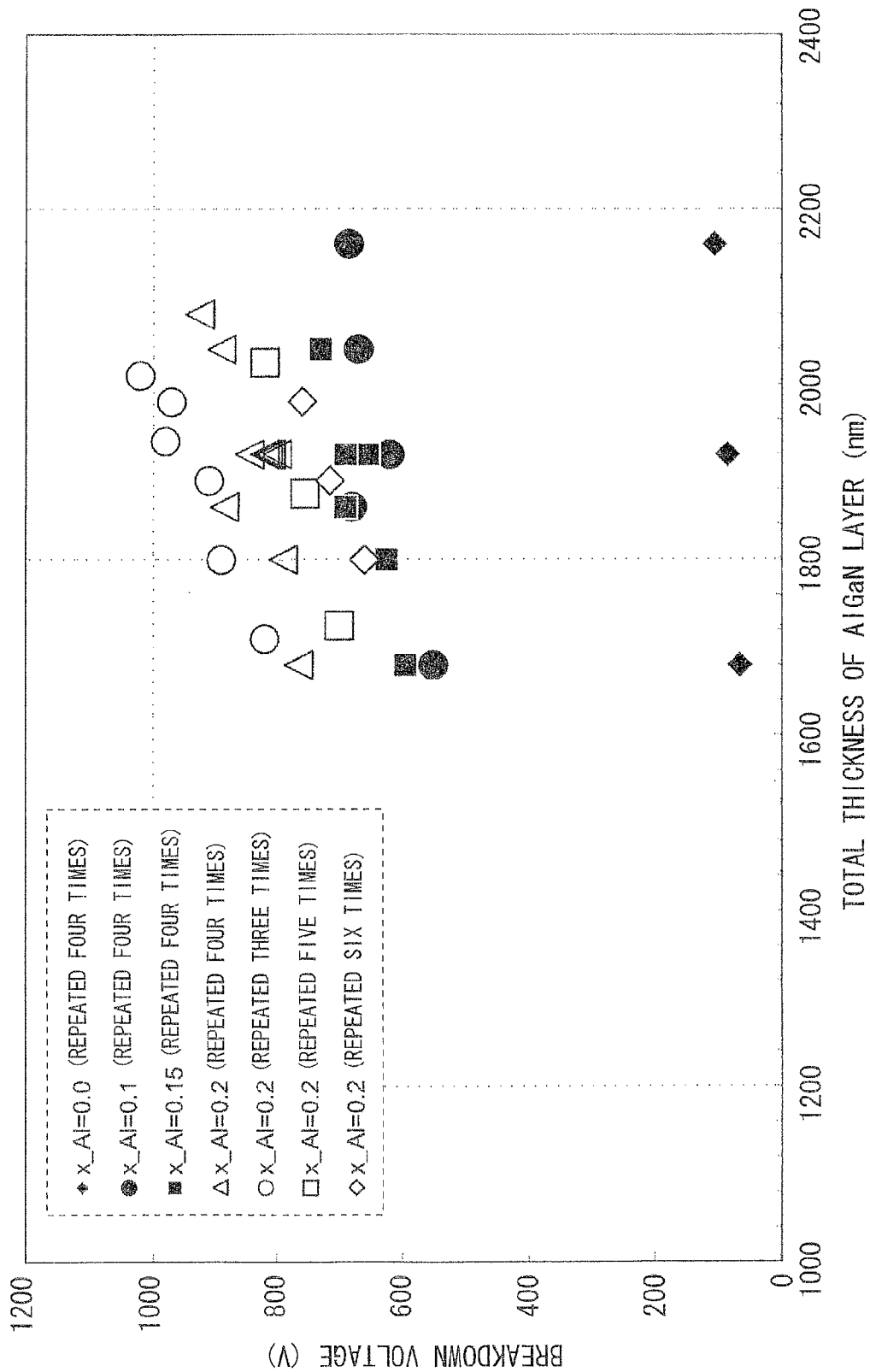
F I G. 6

F I G. 7

| SPECIMEN No. | BUFFER LAYER | | | | | | | | EPITAXIAL FILM | EVALUATION RESULT | | BREAKDOWN VOLTAGE (LEAKAGE CURRENT) 1mA/cm² [V] |
|---|---|---|---|---|---|---|---|---|---|---|---|---|
| | CONFIGURATION OF UNIT STRUCTURE | | | | | | | TOTAL THICKNESS [nm] | TOTAL FILM THICKNESS [μm] | OCCURRENCE OF CRACKING | WARPING [μm] | |
| | COMPOSITION MODULATION LAYER | | TERMINATION LAYER | FIRST INTERMEDIATE LAYER | | K | SECOND INTERMEDIATE LAYER E [nm] | | | | | |
| | x | n | G [nm] | y | D [nm] | | | | | | | |
| c-1 | 0 | 20 | 20 | 0 | 120 | 4 | 15 | 2145 | 3.01 | NOT OBSERVED | 47 | 65 |
| c-2 | 0 | 15 | 20 | 0 | 240 | 4 | 15 | 2225 | 3.09 | NOT OBSERVED | 41 | 90 |
| c-3 | 0 | 20 | 50 | 0 | 120 | 4 | 15 | 2145 | 3.01 | NOT OBSERVED | 46 | 70 |
| c-4 | 0 | 15 | 50 | 0 | 240 | 4 | 15 | 2225 | 3.09 | NOT OBSERVED | 42 | 95 |
| c-5 | 0.1 | 20 | 20 | 0.1 | 120 | 4 | 15 | 2145 | 3.01 | NOT OBSERVED | 60 | 620 |
| c-6 | 0.1 | 15 | 20 | 0.1 | 240 | 4 | 15 | 2225 | 3.09 | NOT OBSERVED | 54 | 680 |
| c-7 | 0.1 | 20 | 50 | 0.1 | 120 | 4 | 15 | 2145 | 3.01 | NOT OBSERVED | 62 | 625 |
| c-8 | 0.1 | 15 | 50 | 0.1 | 240 | 4 | 15 | 2225 | 3.09 | NOT OBSERVED | 54 | 675 |
| c-9 | 0.15 | 20 | 20 | 0.15 | 120 | 4 | 15 | 2145 | 3.01 | NOT OBSERVED | 66 | 655 |
| c-10 | 0.15 | 15 | 20 | 0.15 | 240 | 4 | 15 | 2225 | 3.09 | NOT OBSERVED | 59 | 690 |
| c-11 | 0.15 | 20 | 50 | 0.15 | 120 | 4 | 15 | 2145 | 3.01 | NOT OBSERVED | 65 | 660 |
| c-12 | 0.15 | 15 | 50 | 0.15 | 240 | 4 | 15 | 2225 | 3.09 | NOT OBSERVED | 54 | 695 |
| c-13 | 0.2 | 20 | 20 | 0.2 | 120 | 4 | 15 | 2145 | 3.01 | NOT OBSERVED | 60 | 820 |
| c-14 | 0.2 | 15 | 20 | 0.2 | 240 | 4 | 15 | 2225 | 3.09 | NOT OBSERVED | 53 | 885 |
| c-15 | 0.2 | 20 | 50 | 0.2 | 120 | 4 | 15 | 2145 | 3.01 | NOT OBSERVED | 60 | 815 |
| c-16 | 0.2 | 15 | 50 | 0.2 | 240 | 4 | 15 | 2225 | 3.09 | NOT OBSERVED | 52 | 880 |

EPITAXIAL SUBSTRATE WITH INTERMEDIATE LAYERS FOR REINFORCING COMPRESSIVE STRAIN IN LAMINATED COMPOSITION LAYERS AND MANUFACTURING METHOD THEREOF

BACKGROUND OF THE INVENTION

1. Field of the Invention

The present invention relates to an epitaxial substrate for use in a semiconductor device, and particularly to an epitaxial substrate made of a group-III nitride.

2. Description of Related Art

A nitride semiconductor is attracting attention as a semiconductor material for a light-emitting device such as a LED or a LD and for a high-frequency/high-power electronic device such as a HEMT, because the nitride semiconductor has a wide band gap of direct transition type and the breakdown electric field and the saturation electron velocity thereof are high. For example, a HEMT (high electron mobility transistor) device in which a barrier layer made of AlGaN and a channel layer made of GaN are laminated takes advantage of the feature that causes a high-concentration two-dimensional electron gas (2DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as SiC, is used as a base substrate for use in a HEMT-device epitaxial substrate. In this case, a buffer layer such as a strained-superlattice layer or a low-temperature growth buffer layer is generally formed as an initially-grown layer on the base substrate. Accordingly, a configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of, for example, MN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

The HEMT device and the HEMT-device substrate involve various problems including problems concerning improvement of the performance such as increasing the power density and efficiency, problems concerning improvement of the functionality such as a normally-off operation, fundamental problems concerning a high reliability and cost reduction, and the like. Active efforts are made on each of the problems.

On the other hand, in the preparation of the above-mentioned nitride device, research and development have been made about the use of single crystal silicon for a base substrate for the purpose of reduction of the cost of an epitaxial substrate, furthermore, integration with a silicon-based circuit device, and the like (for example, see Patent Documents 1 to 3, and Non-Patent Document 2). In a case where a conductive material such as silicon is selected as the base substrate of the HEMT-device epitaxial substrate, a field plate effect is applied from a back surface of the base substrate, and therefore a HEMT device can be designed for a high breakdown voltage and high-speed switching.

It is already known that, in order that the HEMT-device epitaxial substrate can be structured with a high breakdown voltage, it is effective to increase the total film thickness of the channel layer and the barrier layer and to improve the electrical breakdown strength of both of the layers (for example, see Non-Patent Document 2).

A method for manufacturing a semiconductor device is also known in which an interposed layer made of AlN is formed on a Si base substrate, then a first semiconductor layer made of GaN and a second semiconductor layer made of AlN are alternately formed so as to cause convex warping as a whole, and then these layers are made contract at a subsequent temperature drop, to result in cancellation of the warping of the entire substrate (for example, see Patent Document 4).

However, it is known that forming a nitride film of good quality on a silicon substrate is very difficult as compared with a case of using a sapphire substrate or a SiC substrate, for the following reasons.

Firstly, the values of the lattice constants of silicon and a nitride material are greatly different from each other. This causes a misfit dislocation at an interface between the silicon substrate and a growth film, and facilitates a three-dimensional growth mode at a timing from the nucleus formation to the growth. In other words, this is a factor that hinders the formation of a good nitride epitaxial film having a low dislocation density and a flat surface.

Additionally, the nitride material has a higher thermal expansion coefficient value than that of silicon. Therefore, in the step of lowering the temperature to the vicinity of the room temperature after a nitride film is epitaxially grown on the silicon substrate at a high temperature, a tensile stress acts in the nitride film. As a result, it is likely that cracking occurs in a film surface and large warping occurs in the substrate.

Moreover, it is also known that trimethylgallium (TMG) that is a material gas of the nitride material for a vapor-phase growth is likely to form a liquid-phase compound with silicon, which is a factor that hinders the epitaxial growth.

In a case where the conventional techniques disclosed in the Patent Documents 1 to 3 and in the Non-Patent Document 1 are adopted, it is possible to cause an epitaxial growth of a GaN film on the silicon substrate. However, the resulting GaN film never has a better crystal quality as compared with a case of using SiC or sapphire for the base substrate. Therefore, preparing an electronic device such as a HEMT using the conventional techniques involves problems of a low electron mobility, a leakage current during the off-time, and a low breakdown voltage.

Furthermore, in the method disclosed in the Patent Document 4, large convex warping is intentionally caused in the course of the device preparation. This may cause cracking in the course of the device preparation, depending on conditions under which the layers are formed.

PRIOR-ART DOCUMENTS

Patent Documents

Patent Document 1: Japanese Patent Application Laid-Open No. 10-163528 (1998)
Patent Document 2: Japanese Patent Application Laid-Open No. 2004-349387
Patent Document 3: Japanese Patent Application Laid-Open No. 2005-350321
Patent Document 4: Japanese Patent Application Laid-Open No. 2009-289956

Non-Patent Documents

Non-Patent Document 1: "Highly Reliable 250 W GaN High Electron Mobility Transistor Power Amplifier", Toshihide Kikkawa, Jpn. J. Appl. Phys. 44, (2005), 4896.

Non-Patent Document 2: "High power AlGaN/GaN HFET with a high breakdown voltage of over 1.8 kV on 4 inch Si substrates and the suppression of current collapse", Nariaki Ikeda, Syuusuke Kaya, Jiang Li, Yoshihiro Sato, Sadahiro Kato, Seikoh Yoshida, Proceedings of the 20th International Symposium on Power Semiconductor Devices & IC's May 18-22, 2008 Orlando, Fla.", pp. 287-290

SUMMARY OF THE INVENTION

The present invention has been made in view of the problems described above, and an object of the present invention is to provide a crack-free epitaxial substrate in which a silicon substrate is used as a base substrate.

To solve the problems described above, a first aspect of the present invention is an epitaxial substrate in which a group of group-III nitride layers are formed on a base substrate made of (111)-oriented single crystal silicon such that a (0001) crystal plane of the group of group-III nitride layers is substantially in parallel with a substrate surface of the base substrate. The epitaxial substrate includes: a buffer layer formed of a first lamination unit and a second lamination unit being alternately laminated such that each of an uppermost portion and a lowermost portion of the buffer layer is formed of the first lamination unit; and a crystal layer formed on the buffer layer. The first lamination unit includes: a composition modulation layer formed of a first unit layer and a second unit layer having different compositions being alternately and repeatedly laminated so that a compressive strain exists therein; and a first intermediate layer for enhancing the compressive strain existing in the composition modulation layer. The second lamination unit is a second intermediate layer that is substantially strain-free.

In a second aspect of the present invention, in the epitaxial substrate according to the first aspect, a first group-III nitride of the first unit layer has an in-plane lattice constant, under a strain-free state, greater than that of a second group-III nitride of the second unit layer, and each of the second unit layers is formed so as to be in a coherent state relative to the first unit layer.

In a third aspect of the present invention, in the epitaxial substrate according to the first aspect, the first intermediate layer is made of a third group-III nitride and formed so as to be in a coherent state relative to the composition modulation layer.

In a fourth aspect of the present invention, in the epitaxial substrate according to the third aspect, the second intermediate layer is made of a fourth group-III nitride whose in-plane lattice constant under a strain-free state is smaller than that of the third group-III nitride.

A fifth aspect of the present invention is an epitaxial substrate in which a group of group-III nitride layers are formed on a base substrate made of (111)-oriented single crystal silicon such that a (0001) crystal plane of the group of group-III nitride layers is substantially in parallel with a substrate surface of the base substrate, the epitaxial substrate. The epitaxial substrate includes: a buffer layer formed of a first lamination unit and a second lamination unit being alternately laminated such that each of an uppermost portion and a lowermost portion of the buffer layer is formed of the first lamination unit; and a crystal layer made of a group-III nitride and formed on the buffer layer. The first lamination unit includes: a composition modulation layer formed of a first unit layer and a second unit layer being alternately and repeatedly laminated, the first unit layer and the second unit layer being made of group-III nitrides having different compositions, a first group-III nitride of the first unit layer having an in-plane lattice constant, under a strain-free state, greater than that of a second group-III nitride of the second unit layer; and a first intermediate layer made of a third group-III nitride and formed so as to be in a coherent state relative to the composition modulation layer. In the composition modulation layer, each of the second unit layers is formed so as to be in a coherent state relative to the first unit layer. The second lamination unit is a second intermediate layer made of a fourth group-III nitride whose in-plane lattice constant under a strain-free state is smaller than that of the third group-III nitride.

In a sixth aspect of the present invention, in the epitaxial substrate according to the fifth aspect, the first unit layer is made of AlN, and the second unit layer is made of a group-III nitride having a composition of $Al_xGa_{1-x}N$ ($0 \leq x \leq 0.25$).

In a seventh aspect of the present invention, in the epitaxial substrate according to the sixth aspect, the first intermediate layer is made of a group-III nitride having a composition of $Al_yGa_{1-y}N$ ($0 \leq y \leq 0.25$) and formed with a thickness of 100 nm or more and 500 nm or less.

In an eighth aspect of the present invention, in the epitaxial substrate according to the seventh aspect, the second intermediate layer is made of AlN and formed with a thickness of 15 nm or more and 150 nm or less.

In a ninth aspect of the present invention, in the epitaxial substrate according to the sixth aspect, the second unit layer is made of a group-III nitride having a composition of $Al_xGa_{1-x}N$ ($0.1 \leq x \leq 0.25$), and the first intermediate layer is made of a group-III nitride having a composition of $Al_yGa_{1-y}N$ ($0.1 \leq y \leq 0.25$).

In a tenth aspect of the present invention, in the epitaxial substrate according to the ninth aspect, the total film thickness of all layers formed on the base substrate is equal to or smaller than 4.0 µm, and the sum of the film thicknesses of all of the second unit layers and the first intermediate layers is equal to or greater than 1700 nm.

In an eleventh aspect of the present invention, in the epitaxial substrate according to the ninth aspect, the composition of the second unit layer is substantially the same as the composition of the first intermediate layer.

In a twelfth aspect of the present invention, in the epitaxial substrate according to the fifth aspect, a termination layer having the same composition as that of the first unit layer is provided on an uppermost portion of the composition modulation layer.

In a thirteenth aspect of the present invention, in the epitaxial substrate according to the twelfth aspect, the thickness of the termination layer is greater than the thickness of the first unit layer.

In a fourteenth aspect of the present invention, the epitaxial substrate according to the fifth aspect further includes: a first base layer made of AlN and formed on the base substrate; and a second base layer made of $Al_pGa_{1-p}N$ ($0 \leq p < 1$) and formed on the first base layer. The first base layer is a layer with many crystal defects configured of at least one kind from a columnar or granular crystal or domain. An interface between the first base layer and the second base layer defines a three-dimensional concavo-convex surface. The buffer layer is formed immediately on the second base layer.

A fifteenth aspect of the present invention is a method for manufacturing an epitaxial substrate for use in a semiconductor device, the epitaxial substrate having a group of group-III nitride layers formed on a base substrate made of (111)- oriented single crystal silicon such that a (0001) crystal plane of the group of group-III nitride layers is substantially in parallel with a substrate surface of the base substrate. The method includes: a buffer layer formation step for forming a buffer layer by alternately laminating a first lamination unit and a second lamination unit such that each of an uppermost portion and a lowermost portion of the buffer layer is formed of the first lamination unit; and a crystal layer formation step for forming a crystal layer above the buffer layer, the crystal layer being made of a group-III nitride. In the buffer layer formation step, formation of the first lamination unit includes: a composition modulation layer formation step for forming a composition modulation layer by alternately and repeatedly laminating a first unit layer and a second unit layer made of group-III nitrides having different compositions; and a first intermediate layer formation step for forming a first intermediate layer on the composition modulation layer. In the buffer layer formation step, formation of the second lamination unit includes: a second intermediate layer formation step for forming a second intermediate layer on the first intermediate layer. In the composition modulation layer formation step, the formation is performed such that: a first group-III nitride of the first unit layer has an in-plane lattice constant, under a strain-free state, greater than that of a second group-III nitride of the second unit layer; and each of the second unit layers is in a coherent state relative to the first unit layer. In the first intermediate layer formation step, the first intermediate layer is formed of a third group-III nitride so as to be in a coherent state relative to the composition modulation layer. In the second intermediate layer formation step, the second intermediate layer is formed of a fourth group-III nitride whose in-plane lattice constant under a strain-free state is smaller than that of the third group-III nitride.

In a sixteenth aspect of the present invention, in the method for manufacturing the epitaxial substrate according to the fifteenth aspect, the first unit layer is made of AlN, and the second unit layer is made of a group-III nitride having a composition of $Al_xGa_{1-x}N$ ($0 \leq x \leq 0.25$).

In a seventeenth aspect of the present invention, in the method for manufacturing the epitaxial substrate according to the sixteenth aspect, the first intermediate layer is made of a group-III nitride having a composition of $Al_yGa_{1-y}N$ ($0 \leq y \leq 0.25$), and formed with a thickness of 100 nm or more and 500 nm or less.

In an eighteenth aspect of the present invention, in the method for manufacturing the epitaxial substrate according to the seventeenth aspect, the second intermediate layer is made of AlN and formed with a thickness of 15 nm or more and 150 nm or less.

In a nineteenth aspect of the present invention, in the method for manufacturing the epitaxial substrate according to the sixteenth aspect, the second unit layer is made of a group-III nitride having a composition of $Al_xGa_{1-x}N$ ($0.1 \leq x \leq 0.25$), and the first intermediate layer is made of a group-III nitride having a composition of $Al_yGa_{1-y}N$ ($0.1 \leq y \leq 0.25$).

In a twentieth aspect of the present invention, in the method for manufacturing the epitaxial substrate according to the nineteenth aspect, the total film thickness of all layers formed on the base substrate is equal to or smaller than 4.0 μm, and the sum of the film thicknesses of all of the second unit layers and the first intermediate layers is equal to or greater than 1700 nm.

In a twenty-first aspect of the present invention, in the method for manufacturing the epitaxial substrate according to the nineteenth aspect, the composition of the second unit layer is substantially the same as the composition of the first intermediate layer.

In a twenty-first aspect of the present invention, in the method for manufacturing the epitaxial substrate according to the fifteenth aspect, the formation of the first lamination unit includes a termination layer formation step for forming a termination layer on an uppermost portion of the composition modulation layer, the termination layer having the same composition as that of the first unit layer; and the first intermediate layer is formed on the termination layer.

In a twenty-third aspect of the present invention, in the method for manufacturing the epitaxial substrate according to the twenty-first aspect, in the termination layer formation step, the termination layer is formed thicker than the first unit layer.

In a twenty-fourth aspect of the present invention, the method for manufacturing the epitaxial substrate according to the fifteenth aspect further includes: a first base layer formation step for forming a first base layer on the base substrate, the first base layer being made of AlN; and a second base layer formation step for forming a second base layer on the first base layer, the second base layer being made of $Al_pGa_{1-p}N$ ($0 \leq p < 1$). In the first base layer formation step, the first base layer is formed as a layer with many crystal defects configured of at least one kind from a columnar or granular crystal or domain, such that a surface thereof is a three-dimensional concavo-convex surface. In the buffer layer formation step, the buffer layer is formed immediately on the second base layer.

In the first to twenty-fourth aspects of the present invention, the compressive strain exists in the buffer layer. Accordingly, a tensile stress caused by a difference in a thermal expansion coefficient between silicon and a group-III nitride is cancelled by the compressive strain. Therefore, a crack-free epitaxial substrate having a small amount of warping and an excellent crystal quality can be obtained even when a silicon substrate is used as the base substrate.

Particularly, in the ninth to eleventh aspects and nineteenth to twenty-first aspects, a crack-free epitaxial substrate having a small amount of warping and excellent breakdown voltage properties is achieved.

Particularly, in the thirteenth and twenty-third aspects, an epitaxial substrate having a further smaller amount of warping is achieved.

Particularly, in the fourteenth and twenty-fourth aspects; the buffer layer is provided on the base layer having a low dislocation and an excellent surface flatness. Accordingly, the buffer layer, the crystal layer, and the like, have good crystal quality. On the other hand, an accumulation of strain energy in the second base layer is suppressed. Therefore, the effect of canceling the tensile stress exerted by the compressive strain existing in the buffer layer is not hindered by any accumulation of strain energy in the base layer.

BRIEF DESCRIPTION OF THE DRAWINGS

FIG. 4 is a diagram showing a list of a configuration of each layer, the presence or absence of occurrence of cracking, and the amount of warping, with respect to an epitaxial substrate 10 according to an example 1.

FIG. 5 is a diagram showing a list of a configuration of each layer, the presence or absence of occurrence of cracking, and the amount of warping, with respect to an epitaxial substrate 10 according to an example 2.

FIG. 6 is a diagram plotting the breakdown voltage against the total thickness of an AlGaN layer.

FIG. 7 is a diagram showing a list of a configuration of each layer, the presence or absence of occurrence of cracking, and the amount of warping, with respect to an epitaxial substrate 10 according to an example 3.

DETAILED DESCRIPTION OF THE INVENTION

<Outline Configuration of Epitaxial Substrate>

Figure 1:
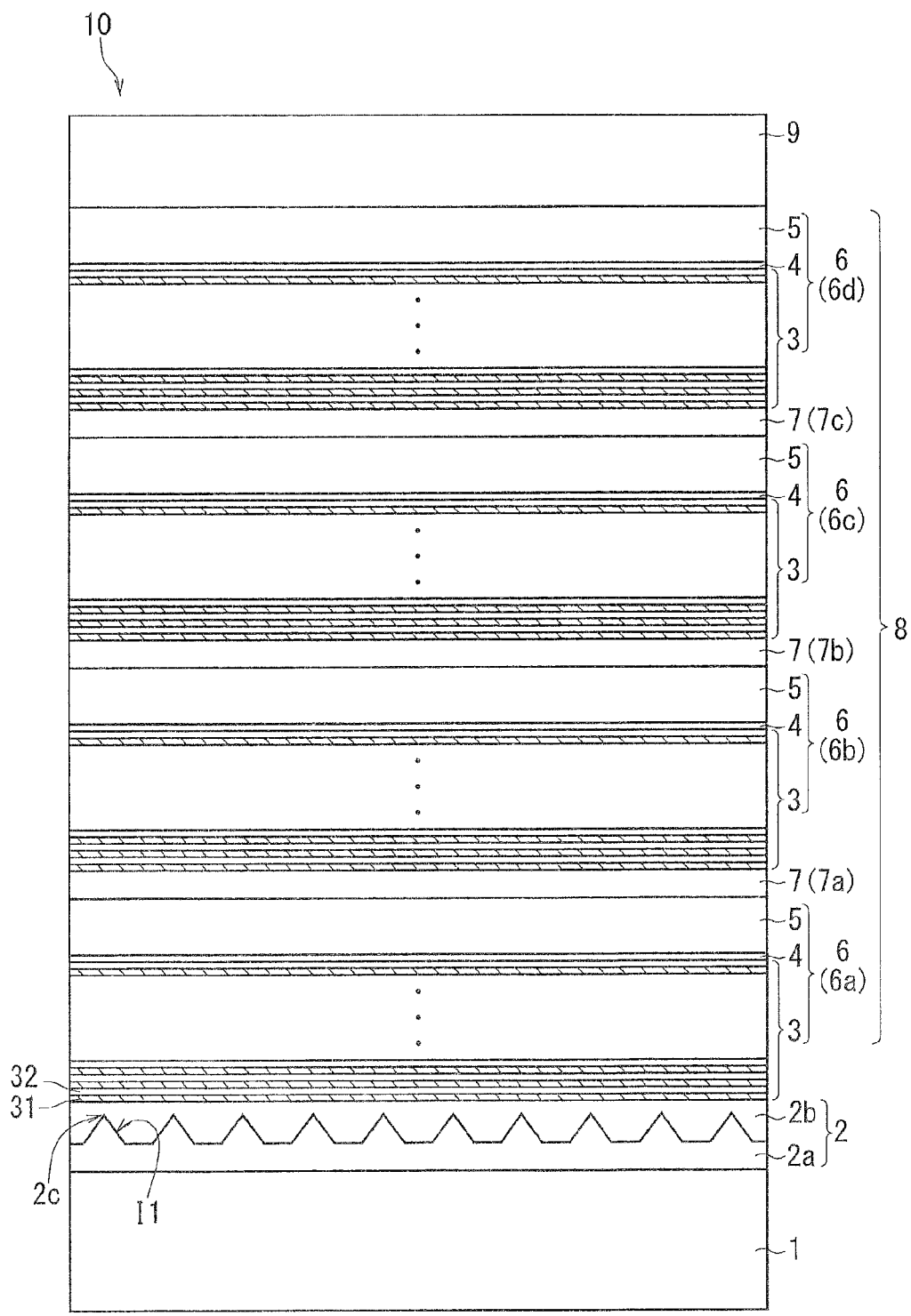
FIG. 1 is a schematic cross-sectional view showing an outline configuration of an epitaxial substrate 10 according to an embodiment of the present invention.

FIG. 1 is a schematic cross-sectional view showing an outline configuration of an epitaxial substrate 10 according to an embodiment of the present invention.

The epitaxial substrate 10 mainly includes a base substrate 1, a base layer 2, a buffer layer 8, and a function layer 9. The buffer layer 8 includes a plurality of composition modulation layers 3, a plurality of termination layers 4, a plurality of first intermediate layers 5, and a plurality of second intermediate layers 7. In the following, the layers formed on the base substrate 1 will be sometimes collectively referred to as an epitaxial film. Here, for convenience of the description, the proportion of existence of Al in the group-III elements will be sometimes referred to as Al mole fraction.

The base substrate 1 is a wafer of (111) plane single crystal silicon having p-type conductivity. The thickness of the base substrate 1 is not particularly limited, but for convenience of handling, it is preferable to use the base substrate 1 having a thickness of several hundred μm to several mm.

Each of the base layer 2, the composition modulation layer 3, the termination layer 4, the first intermediate layer 5, the second intermediate layer 7, and the function layer 9 is a layer formed of a wurtzite-type group-III nitride by using an epitaxial growth method such that a its (0001) crystal plane can be substantially in parallel with a substrate surface of the base substrate 1. In a preferred example, these layers are formed by a metalorganic chemical vapor deposition method (MOCVD method).

The base layer 2 is a layer provided for the purpose of enabling each of the above-mentioned layers to be formed thereon with a good crystal quality. To be specific, the base layer 2 is formed in such a manner that its dislocation density is suitably reduced and it has a good crystal quality at least near a surface thereof (near an interface with the composition modulation layer 3). As a result, a good crystal quality is obtained in the composition modulation layer 3, and additionally in the layers formed thereon.

In this embodiment, to satisfy the purpose, the base layer 2 is composed of a first base layer 2a and a second base layer 2b, as described below.

The first base layer 2a is a layer made of AlN. The first base layer 2a is a layer configured of a large number of small columnar crystals or the like (at least one kind from columnar crystals, granular crystals, columnar domains, and granular domains) that have been grown in a direction (film formation direction) substantially perpendicular to the substrate surface of the base substrate 1. In other words, the first base layer 2a is a layer with many defects having inferior crystal properties, in which, although uniaxial orientation is achieved along a lamination direction of the epitaxial substrate 10, many crystal grain boundaries or dislocations exist along the lamination direction. In this embodiment, for convenience of the description, the crystal grain boundary is sometimes used as the term inclusive of domain grain boundaries and dislocations, too. In the first base layer 2a, the interval of the crystal grain boundaries is at most about several tens nm.

The first base layer 2a having this configuration is formed such that the half width of a (0002) X-ray rocking curve can be 0.5 degrees or more and 1.1 degrees or less and such that the half width of a (10-10) X-ray rocking curve can be 0.8 degrees or more and 1.1 degrees or less. The half width of the (0002) X-ray rocking curve serves as an index of the magnitude of mosaicity of a c-axis tilt component or the frequency of screw dislocations. The half width of the (10-10) X-ray rocking curve serves as an index of the magnitude of mosaicity of a crystal rotation component whose rotation axis is c-axis or the frequency of edge dislocations.

On the other hand, the second base layer 2b is a layer formed on the first base layer 2a and made of a group-III nitride having a composition of $Al_pGa_{1-p}N$ ($0 \leq p < 1$).

An interface I1 (a surface of the first base layer 2a) between the first base layer 2a and the second base layer 2b is a three-dimensional concavo-convex surface that reflects the outer shapes of the columnar crystals and the like included in the first base layer 2a. The fact that the interface I1 has such a shape is clearly confirmed in, for example, a HAADF (high-angle annular dark-field) image of the epitaxial substrate 10. The HAADF image is obtained by a scanning transmission electron microscope (STEM), and is a mapping image of the integrated intensity of electron that is inelastically scattered at a high angle. In the HAADF image, the image intensity is proportional to the square of an atomic number, and a portion where an atom having a greater atomic number exists is observed more brightly (more white). Therefore, the second base layer 2b containing Ga is observed relatively bright, and the first base layer 2a not containing Ga is observed relatively dark. Thereby, the fact the interface I1 therebetween is a three-dimensional concavo-convex surface is easily recognized.

In the schematic cross-section of FIG. 1, convex portions 2c of the first base layer 2a are located at substantially regular intervals. This is merely for convenience of illustration. Actually, the convex portions 2c are not necessarily located at regular intervals. Preferably, the first base layer 2a is formed such that the density of the convex portions 2c can be $5 \times 10^9$/cm$^2$ or more and $5 \times 10^{10}$/cm$^2$ or less and the average interval of the convex portions 2c can be 45 nm or more and 140 nm or less. When these ranges are satisfied, the function layer 9 having, particularly, an excellent crystal quality can be formed. In this embodiment, the convex portion 2c of the first base layer 2a always denotes a position substantially at the apex of an upward convex portion of the surface (interface I1). From the results of experiments and observations made by the inventors of the present invention, it has been confirmed that a side wall of the convex portion 2c is formed by a (10-11) plane or (10-12) plane of AlN.

In order that the convex portions 2c that satisfy the above-mentioned density and average interval can be formed on the surface of the first base layer 2a, it is preferable to form the first base layer 2a with an average film thickness of 40 nm or more and 200 nm or less. In a case where the average film thickness is less than 40 nm, it is difficult to achieve a state where the substrate surface is thoroughly covered with AlN while forming the convex portions 2c as described above. On the other hand, when the average film thickness exceeds 200 nm, flattening of an AlN surface starts to progress, to make it difficult to form the convex portions 2c described above.

The formation of the first base layer 2a is performed under predetermined epitaxial growth conditions. Here, forming the first base layer 2a with AlN is preferable in terms of not containing Ga which forms a liquid-phase compound with silicon and in terms of easily configuring the interface I1 as a three-dimensional concavo-convex surface because a horizontal growth is relatively unlikely to progress.

In the epitaxial substrate 10, the first base layer 2a that is a layer with many defects in which the crystal grain boundaries exist is interposed between the base substrate 1 and the second base layer 2b in the above-described manner. This relieves a lattice misfit between the base substrate 1 and the second base layer 2b, and thus an accumulation of strain energy caused by this lattice misfit is suppressed. The above-described ranges of the half widths of the (0002) and (10-10) X-ray rocking curves with respect to the first base layer 2a are set as ranges that can suitably suppress the accumulation of strain energy by the crystal grain boundaries.

However, the interposition of the first base layer 2a causes an enormous number of dislocations originating from the crystal grain boundaries such as the columnar crystals of the first base layer 2a to propagate in the second base layer 2b. In this embodiment, as described above, the interface I1 between the first base layer 2a and the second base layer 2b is configured as a three-dimensional concavo-convex surface, and thereby the dislocations are effectively reduced.

Since the interface I1 between the first base layer 2a and the second base layer 2b is configured as a three-dimensional concavo-convex surface, most of the dislocations caused in the first base layer 2a are bent at the interface I1 during the propagation (penetration) from the first base layer 2a to the second base layer 2b, and coalesce and disappear within the second base layer 2b. As a result, only a small part of the dislocations originating from the first base layer 2a penetrates through the second base layer 2b.

Preferably, although the second base layer 2b is formed along the shape of the surface of the first base layer 2a (the shape of the interface I1) in an initial stage of the growth, the surface thereof is gradually flattened along with the progress of the growth, and finally obtains a surface roughness of 10 nm or less. In this embodiment, the surface roughness is expressed as an average roughness ra in a region of 5 μm×5 μm which has been measured by an AFM (atomic force microscope). Here, in terms of obtaining a good surface flatness of the second base layer 2b, it is preferable that the second base layer 2b is formed of a group-III nitride having a composition that contains at least Ga, which allows a horizontal growth to relatively easily progress.

It is preferable that the second base layer 2b has an average thickness of 40 nm or more. This is because, when the average thickness is less than 40 nm, such problems arise that concaves and convexes caused by the first base layer 2a cannot sufficiently be flattened, and that the disappearance of dislocations having propagated to the second base layer 2b and coalesced with each other does not sufficiently occur. In a case where the average thickness is 40 nm or more, the reduction of the dislocation density and the flattening of the surface are effectively caused. Therefore, in a technical sense, no particular limitation is put on an upper limit of the thickness of the second base layer 2b, but from the viewpoint of the productivity, it is preferable that the thickness is about several μm or less.

As described above, the surface of the second base layer 2b has a low dislocation and an excellent flatness, and therefore the layers formed thereon have a good crystal quality.

The buffer layer 8 has a configuration in which the second intermediate layer 7 is interposed between ones of a plurality of unit structures 6 each including the composition modulation layer 3, the termination layer 4, and the first intermediate layer 5 being laminated in the mentioned order. In other words, the second intermediate layer 7 is provided as a boundary layer between the respective unit structures 6. Alternatively, in still other words, the buffer layer 8 has a configuration in which the uppermost and lowermost portions thereof are the unit structures 6, and the unit structure 6 serving as a first lamination unit and the second intermediate layer 7 serving as a second lamination unit are alternately and repeatedly laminated. Although FIG. 1 illustrates a case where there are four unit structures 6 (6a, 6b, 6c, 6d) and three second intermediate layers 7 (7a, 7b, 7c), the numbers of the unit structures 6 and the second intermediate layers 7 are not limited thereto.

The composition modulation layer 3 is a part having a superlattice structure formed by a first unit layer 31 and a second unit layer 32, which are two kinds of group-III nitride layers having different compositions, being alternately and repeatedly laminated. A pair of one first unit layer 31 and one second unit layer 32 is called a pair layer.

The first unit layer 31 and the second unit layer 32 are formed to satisfy such a relationship that an in-plane lattice constant (lattice length) under a strain-free state (bulk state) is greater in the group-III nitride of the latter than in the group-III nitride of the former.

In the composition modulation layer 3, the second unit layer 32 is formed so as to be coherent to the first unit layer 31. Additionally, the thickness of the first unit layer 31 is greater than the thickness of the second unit layer 32.

The first unit layer 31 is preferably formed with a thickness of about 3 to 20 nm. Typically, the first unit layer 31 is formed with a thickness of 5 to 10 nm. On the other hand, the second unit layer 32 is preferably formed with a thickness of about 10 to 25 nm. The number of repetitions of the pair layer is about five to several tens.

Preferably, the first unit layer 31 is made of AlN, and the second unit layer 32 is made of a group-III nitride having a composition of $Al_xGa_{1-x}N$ ($0 \leq x \leq 0.25$).

The termination layer 4 is a layer made of a group-III nitride having the same composition as that of the first unit layer 31 and formed on an uppermost portion (terminating portion) of the composition modulation layer 3. The termination layer 4 is formed with a thickness equal to or greater than the thickness of the first unit layer 31. Additionally, the termination layer 4 is formed with a thickness in a range that allows the intermediate layer 5 to be formed thereon in a coherent state. To be specific, it is preferable that the termination layer 4 is formed with a thickness of about 3 to 100 nm. Typically, the termination layer 4 is formed with a thickness of 5 to 50 nm.

More preferably, the termination layer 4 is formed with a thickness greater than the thickness of the first unit layer 31. To be specific, the termination layer 4 is formed with a thickness of 20 to 50 nm.

The first intermediate layer 5 is a layer made of a group-III nitride. The first intermediate layer 5 is made of a group-III nitride whose in-plane lattice constant under a strain-free state is greater than that of the group-III nitride of the first unit layer 31. For example, the first intermediate layer 5 is made of a group-III nitride having a composition of $Al_yGa_{1-y}N$ ($0 \leq y \leq 0.25$). The first intermediate layer 5 is formed so as to be coherent to the termination layer 4. It is preferable that the first intermediate layer 5 has a thickness of roughly 100 nm or more and 500 nm or less.

The second intermediate layer 7 is a layer made of a group-III nitride whose in-plane lattice constant under a strain-free state is smaller than that of the group-III nitride of the first intermediate layer 5. It is preferable that the second intermediate layer 7 is formed with a thickness of roughly 15 nm or more and 150 nm or less. Preferably, the second intermediate layer 7 is made of a group-III nitride having the same composition as that of the first unit layer 31 of the composition modulation layer 3. More Preferably, the second intermediate layer 7 is made of AlN.

The number of the pair layers in the composition modulation layer 3 included in the unit structure 6, the actual composition and thickness of the first intermediate layer 5, and the like, are set depending on a manner of formation of the entire buffer layer 8. The Al mole fraction in the second unit layer 32 and in the first intermediate layer 5 has a relationship with breakdown voltage properties of the epitaxial substrate 10 itself. Details thereof will be described later.

The function layer 9 is at least one layer made of a group-III nitride and formed on the buffer layer 8. The function layer 9 is a layer that develops a predetermined function at the situation that predetermined semiconductor layers, electrodes, and the like, are additionally provided on the epitaxial substrate 10 to thereby form a semiconductor device. Accordingly, the function layer 9 is constituted of one or more layers having a composition and a thickness appropriate for this function. Although FIG. 1 illustrates a case where the function layer 9 is constituted of a single layer, the configuration of the function layer 9 is not limited thereto.

For example, a channel layer made of high-resistivity GaN and having a thickness of several with and a barrier layer made of AlGaN, InAlN, or the like and having a thickness of several tens nm are laminated to serve as the function layer 9, and thereby the epitaxial substrate 10 for a HEMT device is obtained. That is, a HEMT device is obtained by forming a gate electrode, a source electrode, and a drain electrode on the barrier layer, though not shown. For forming these electrodes, a known technique such as a photolithography process is applicable. In such a case, a spacer layer made of AlN and having a thickness of about 1 nm may be provided between the channel layer and the barrier layer.

Alternatively, a concentric Schottky diode is achieved by forming one group-III nitride layer (for example, a GaN layer) as the function layer 9 and forming an anode and a cathode thereon, though not shown. For forming these electrodes, too, the known technique such as the photolithography process is applicable.

<Method for Manufacturing Epitaxial Substrate>

Next, a method for manufacturing the epitaxial substrate 10 will be generally described while a case of using the MOCVD method is taken as an example.

Firstly, a single crystal silicon wafer of a (111) plane is prepared as the base substrate 1. A natural oxide film is removed by dilute hydrofluoric acid cleaning. Then, SPM cleaning is performed to create a state where an oxide film having a thickness of several Å is formed on a wafer surface. This is set within a reactor of a MOCVD apparatus.

Then, each layer is formed under predetermined heating conditions and a predetermined gas atmosphere. Firstly, for the first base layer 2a made of AlN, a substrate temperature is maintained at a predetermined initial layer formation temperature of 800° C. or higher and 1200° C. or lower, and the pressure in the reactor is set to be about 0.1 to 30 kPa. In this state, a TMA (trimethylaluminum) bubbling gas that is an aluminum raw material and a $NH_3$ gas are introduced into the reactor with an appropriate molar flow ratio. A film formation speed is set to be 20 nm/min or higher, and a target film thickness is set to be 200 nm or less. Thereby, the formation of the first base layer 2a is achieved.

For the formation of the second base layer 2b, after the formation of the first base layer 2a, a substrate temperature is maintained at a predetermined second base layer formation temperature of 800° C. or higher and 1200° C. or lower, and the pressure in the reactor is set to be 0.1 to 100 kPa. In this state, a TMG (trimethylgallium) bubbling gas that is a gallium raw material, a TMA bubbling gas, and a $NH_3$ gas are introduced into the reactor with a predetermined flow ratio that is appropriate for a composition of the second base layer 2b to be prepared. Thus, $NH_3$ is reacted with TMA and TMG. Thereby, the formation of the second base layer 2b is achieved.

For the formation of the respective layers included in the buffer layer 8, that is, for the formation of the first unit layer 31 and the second unit layer 32 included in the composition modulation layer 3, the termination layer 4, the first intermediate layer 5, and the second intermediate layer 7, subsequent to the formation of the second base layer 2b, a substrate temperature is maintained at a predetermined formation temperature of 800° C. or higher and 1200° C. or lower that is appropriate for each of the layers, and the pressure in the reactor is maintained at a predetermined value of 0.1 to 100 kPa that is appropriate for each of the layers. In this state, a $NH_3$ gas and a group-III nitride material gas (TMA and TMG bubbling gases) are introduced into the reactor with a flow ratio that is appropriate for a composition to be achieved in each of the layers. Thereby, the formation of the respective layers is achieved. At this time, by changing the flow ratio at a timing appropriate for a set film thickness, the respective layers are formed in a continuous manner and with desired film thicknesses.

For the formation of the function layer 9, after the formation of the buffer layer 8, a substrate temperature is maintained at a predetermined function layer formation temperature of 800° C. or higher and 1200° C. or lower, and the pressure in the reactor is set to be 0.1 to 100 kPa. In this state, at least one of a TMI bubbling gas, a TMA bubbling gas, and a TMG bubbling gas, and a $NH_3$ gas are introduced into the reactor with a flow ratio that is appropriate for a composition of the function layer 9 to be prepared. Thus, $NH_3$ is reacted with at least one of TMI, TMA, and TMG. Thereby, the formation of the function layer 9 is achieved.

After the function layer 9 is formed, in the reactor, the temperature of the epitaxial substrate 10 is lowered to an ordinary temperature. Then, the epitaxial substrate 10 is taken out from the reactor and subjected to an appropriate subsequent process (such as patterning of an electrode layer).

<Functions and Effects of Buffer Layer>

Generally, as is the case for this embodiment as well, in a case of preparing an epitaxial substrate by causing a crystal layer made of a group-III nitride to epitaxially grow on a single crystal silicon wafer at a predetermined formation temperature, a tensile stress in an in-plane direction occurs in the crystal layer in the course of lowering the temperature to the ordinary temperature after the crystal growth, because the group-III nitride has a thermal expansion coefficient greater than that of silicon (for example, silicon: $3.4 \times 10^{-6}$/K, GaN: $5.5 \times 10^{-6}$/K). This tensile stress is a factor that causes occurrence of cracking and warping in the epitaxial substrate. In this embodiment, the buffer layer 8 is provided on the epitaxial substrate 10 for the purpose of reducing the tensile stress and suppressing occurrence of cracking and warping. More specifically, due to functions and effects exerted by each of the layers included in the buffer layer 8, occurrence of cracking and warping in the epitaxial substrate 10 is suppressed. In the following, a detailed description will be given.

(Composition Modulation Layer)

Figure 2:
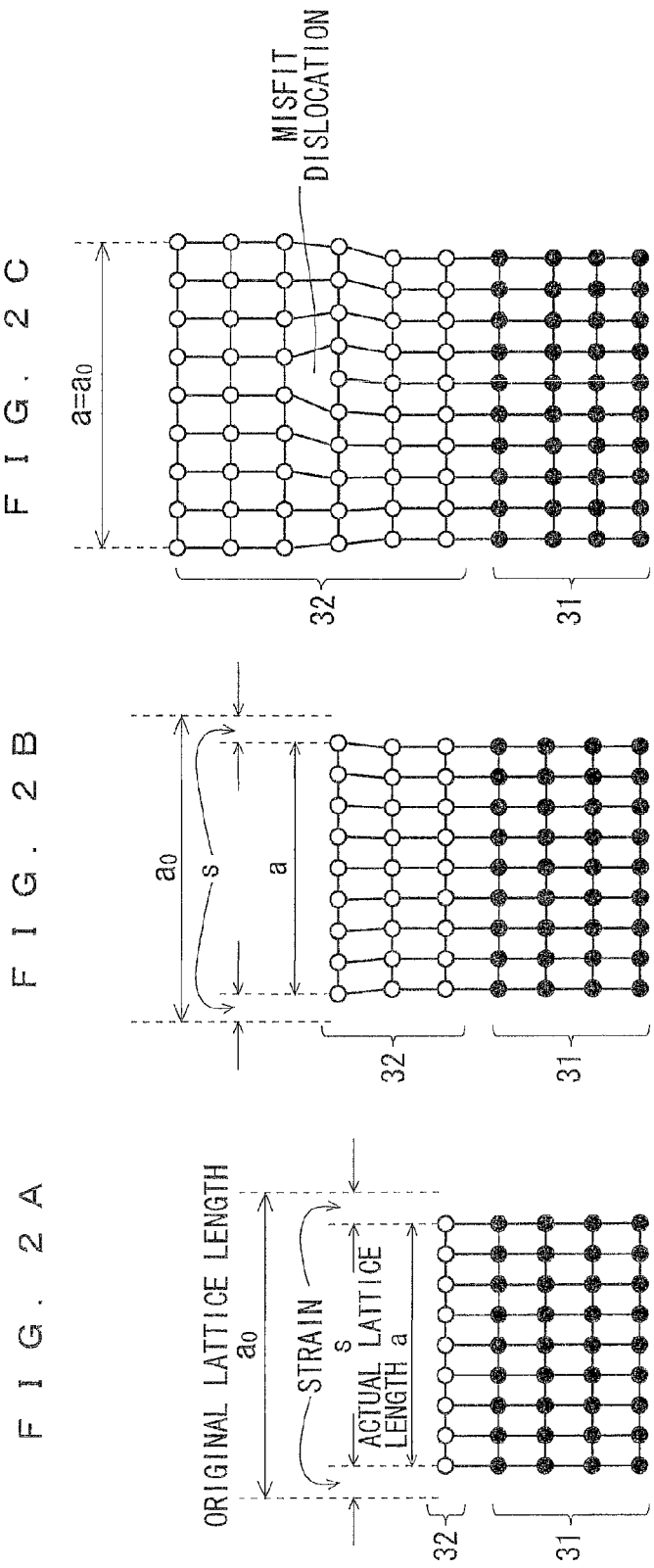
FIGS. 2A, 2B, and 2C are model diagrams showing a crystal lattice at a time when a second unit layer 32 is formed on a first unit layer 31.

FIGS. 2A, 2B, and 2C are model diagrams showing a crystal lattice at a time when the second unit layer 32 is formed on the first unit layer 31 in the composition modulation layer 3. Here, the lattice length, in the in-plane direction, of the group-III nitride of the second unit layer 32 under the strain-free state is defined as $a_0$, and the actual lattice length thereof is defined as a. In this embodiment, as shown in FIGS. 2A and 2B, a crystal growth progresses in the second unit layer 32 while keeping aligned with the crystal lattice of the first unit layer 31. This means that a compressive strain of $s=a_0-a$ occurs in the in-plane direction of the second unit layer 32 during the crystal growth. That is, the crystal growth of the second unit layer 32 progresses with strain energy held therein.

As the growth advances, energy instability increases. Therefore, a misfit dislocation is gradually introduced in the second unit layer 32, for releasing the strain energy. Then, upon reaching a certain critical state, the strain energy held in the second unit layer 32 is fully released. At this time, a state of $a=a_0$ is provided as shown in FIG. 2C.

However, if the formation of the second unit layer 32 is terminated in a state of $a_0>a$ as shown in FIG. 2B prior to reaching the state shown in FIG. 2C, the second unit layer 32 remains holding the strain energy (remains containing the compressive strain). In this embodiment, such a crystal growth with the strain energy contained therein is referred to as a crystal growth in a coherent state. In other words, the second unit layer 32 is in the coherent state relative to the first unit layer 31 as long as the second unit layer 32 is formed with a thickness smaller than a critical film thickness at which the strain energy is fully released. Alternatively, in still other words, the second unit layer 32 is in the coherent state relative to the first unit layer 31 as long as the lattice length a of the uppermost surface of the second unit layer 32 (the surface that will be in contact with the first unit layer 31 located immediately above) satisfies $a_0>a$. Even if $a_0=a$ is provided in a part of the second unit layer 32, it can be said that the second unit layer 32 is in the coherent state relative to the first unit layer 31, as long as the second unit layer 32 contains the strain energy in the above-described manner.

The in-plane lattice constant of the group-III nitride of the first unit layer 31 is smaller than the in-plane lattice constant of the group-III nitride of the second unit layer 32. Therefore, even when the first unit layer 31 is formed on the second unit layer 32 with the strain energy held therein, the coherent state is maintained, not causing a release of the strain energy held in the second unit layer 32 located immediately below. Then, if the second unit layer 32 is again grown on this first unit layer 31 so as to make the coherent state, the same compressive strain as described above is also caused in this second unit layer 32, too.

Subsequently, in the same manner, the formation of the first unit layer 31 and the second unit layer 32 (the formation of the pair layer) is repeated while maintaining the growth in the coherent state. Thereby, the strain energy is held in the second unit layer 32 of each pair layer. Thus, the composition modulation layer 3, as a whole, is formed as a part containing the compressive strain.

The compressive strain introduced in the composition modulation layer 3 acts in a direction exactly opposite to the tensile stress that is caused by a difference in the thermal expansion coefficient, and therefore functions to cancel the tensile stress at the time of temperature drop. In outline, the tensile stress is cancelled by a force that is proportional to the product of the magnitude of the compressive strain in one pair layer and the number of repetitions of the pair layer in the composition modulation layer 3. That is, it can be said that the composition modulation layer 3 is a part introducing a compressive strain into the epitaxial substrate 10.

The first unit layer 31 is interposed between the two second unit layers 32. The first unit layer 31 having too small a thickness is not preferable, because this reduces the compressive strain occurring in the second unit layer 32, and rather, the tensile stress is likely to exist in the first unit layer 31 itself. On the other hand, too large a thickness is not preferable, either, because the second unit layer 32 itself is likely to receive a force in a tensile direction. The above-mentioned requirement that the thickness is about 3 to 20 nm is preferable in terms of not causing such failures.

The above-mentioned requirement that the first unit layer 31 is made of AlN and the second unit layer 32 is made of a group-III nitride having a composition of $Al_xGa_{1-x}N$ ($0 \leq x \leq 0.25$) is preferable in terms of providing a sufficient amount of compressive strain in each individual pair layer.

(Termination Layer)

The termination layer 4 is formed in the uppermost portion of the composition modulation layer 3, and made of a group-III nitride having the same composition as that of the first unit layer 31, that is a group-III nitride whose in-plane lattice constant is smaller than that of the group-III nitride of the second unit layer 32. The termination layer 4 is formed with a thickness greater than the thickness of the first unit layer 31. Presence of the termination layer 4 in such a manner enables the compressive strain introduced in the composition modulation layer 3 to be suitably maintained even in a case where the intermediate layer 5 is provided in a later-described manner.

However, in a case where the thickness of the termination layer 4 is too large, a lattice constant thereof approaches the bulk state, and therefore lattice relaxation is caused in the intermediate layer 5 formed thereon. In such a case, the intermediate layer 5, which is provided originally in order to function as a strain reinforcing layer as described later, does not exert its functions and effects. Therefore, too large a thickness is not preferable. On the other hand, in a case where the thickness of the termination layer 4 is too small, it is likely that a tensile stress exists in the termination layer 4, similarly to the first unit layer 31 interposed between the two second unit layers 32. Therefore, too small a thickness is not preferable. The above-mentioned requirement that the thickness is equal to or greater than the thickness of the first unit layer 31, and the requirement that the thickness is about 3 to 100 nm, are preferable in terms of not causing such failures.

In a case where the thickness of the termination layer 4 is greater than the thickness of the first unit layer 31, warping of the epitaxial substrate 10 is more effectively reduced. This manner is preferable particularly to obtain the epitaxial substrate 10 having a high breakdown voltage and suppressed warping.

(First Intermediate Layer)

Figure 3:
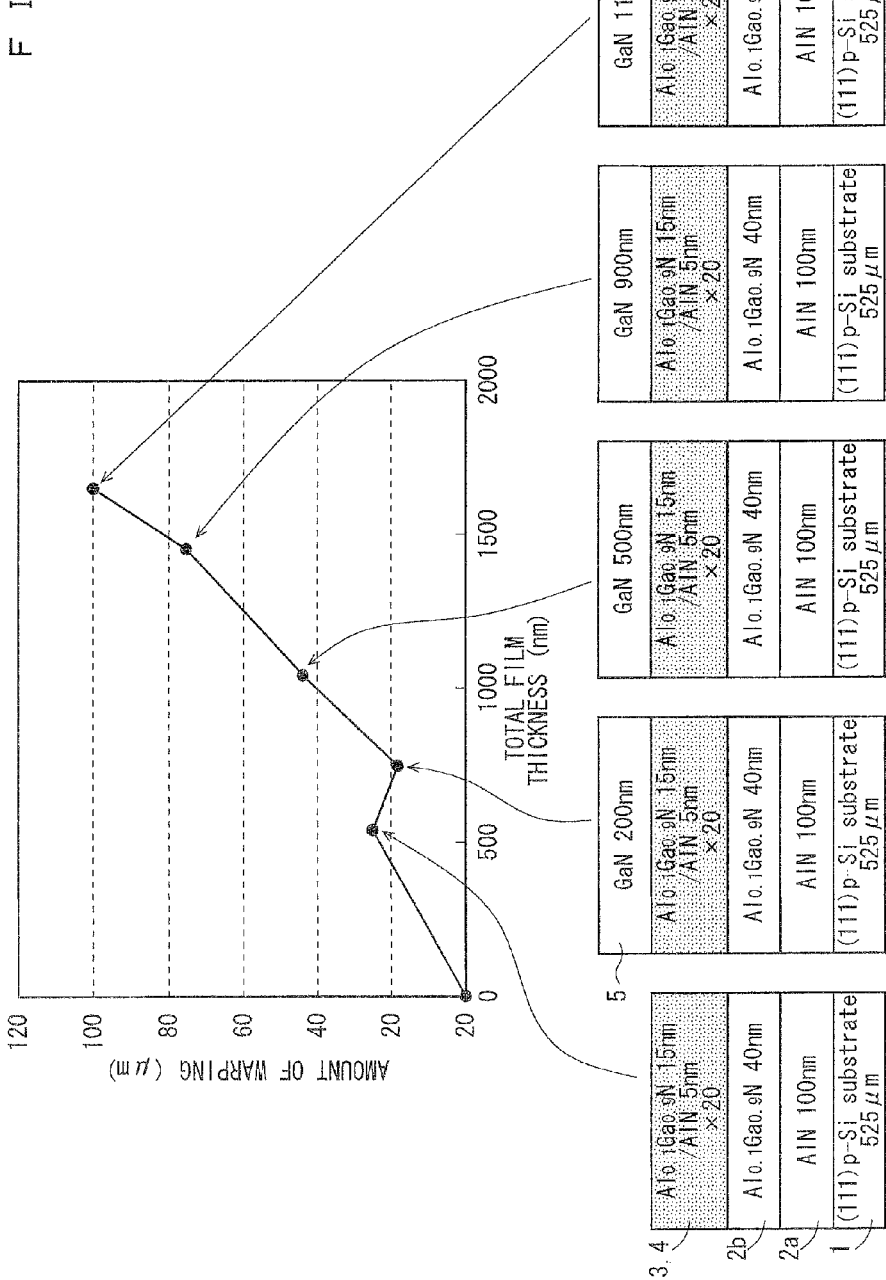
FIG. 3 is a diagram plotting, against the thickness of a first intermediate layer 5, the amount of warping in an epitaxial substrate in which the steps up to the formation of the first intermediate layer 5 have been performed.

FIG. 3 is a diagram showing the relationship between the thickness of the first intermediate layer 5 and the amount of warping in an epitaxial substrate in which the steps up to the formation of the first intermediate layer 5 have been performed. In FIG. 3, the horizontal axis represents the total film thickness of the epitaxial film. In this embodiment, the amount of warping in the epitaxial substrate is measured by a laser displacement gauge.

In five examples shown in FIG. 3, all the conditions are the same, except for the thickness of the first intermediate layer 5. A (111) single crystal silicon wafer (with a thickness of 525 μm) having the p-type conductivity is adopted as the base substrate 1. Thereon, the first base layer 2a made of AlN with an average film thickness of 100 nm, the second base layer 2b made of $Al_{0.1}Ga_{0.9}N$ with an average film thickness of 40 nm, the composition modulation layer 3, the termination layer 4 not shown, and the first intermediate layer 5 made of GaN are laminated. In the composition modulation layer 3, the pair layer including the first unit layer 31 made of AlN with a thickness of 5 nm and the second unit layer 32 made of $Al_{0.1}Ga_{0.9}N$ with a thickness of 15 nm, are repeatedly laminated twenty times.

In FIG. 3, the amount of warping in the epitaxial substrate exhibits the local minimum when the thickness of the first intermediate layer 5 is 200 nm. As described above, the first intermediate layer 5 is formed in the coherent state relative to the termination layer 4. Accordingly, the result shown in FIG. 3 suggests that the first intermediate layer 5 formed with a thickness of about 200 nm exerts functions and effects for enhancing the compressive strain having been introduced in the epitaxial substrate 10 by the buffer layer 8. In consideration of this result, in this embodiment, the first intermediate layer 5 is formed with a thickness of about 100 nm or more and 500 nm or less, to thereby enhance the compressive strain introduced in the composition modulation layer 3. Consequently, in the epitaxial substrate 10, the tensile stress is more effectively cancelled. Thus, in the epitaxial substrate 10, the first intermediate layer 5 functions as a strain reinforcing layer.

As shown in FIG. 3, when the thickness of the first intermediate layer 5 becomes too large, the amount of warping in the epitaxial substrate 10 increases. This is because, as the crystal grows, an accumulation of the strain energy reaches a limit so that the compressive strain is weakened and it becomes difficult for the lattice to grow while kept in the coherent state, and eventually the critical film thickness is exceeded to consequently release the strain energy. Such increase in the amount of warping is a factor that causes cracking. In FIG. 3, although the amount of warping when the thickness of the first intermediate layer 5 is 500 nm is larger than when the first intermediate layer 5 is not provided, the inventors of the present invention have confirmed that, in the actual epitaxial substrate 10 in which a plurality of unit structures 6 are laminated, the compressive strain in the buffer layer 8 can be suitably enhanced as long as the thickness of the first intermediate layer 5 is 500 nm or less.

(Second Intermediate Layer)

As a result of forming the composition modulation layer 3 and the first intermediate layer 5 in the above-described manner, the compressive strain exists in the entire unit structure 6. Therefore, it is supposed that a large compressive strain sufficient for preventing occurrence of cracking should be obtained by laminating a plurality of the unit structures 6. However, actually, even though one unit structure 6 is formed immediately on another unit structure 6, a sufficient compressive strain cannot be obtained in the upper unit structure 6, for the following reasons. The group-III nitride of the first intermediate layer 5 that is the uppermost layer of the lower unit structure 6 has an in-plane lattice constant, under the strain-free state, greater than that of the group-III nitride of the first unit layer 31 that is the lowermost layer of the upper unit structure 6. Additionally, the first unit layer 31 is formed with a thickness of only about 3 to 20 nm. Accordingly, if the first unit layer 31 is formed directly on the first intermediate layer 5, a tensile strain exists in the first unit layer 31, and thus a sufficient compressive strain cannot be introduced in the composition modulation layer 3.

Therefore, in this embodiment, the second intermediate layer 7 is provided between the unit structures 6, thereby preventing occurrence of the above-described failures involved in the introduction of the tensile strain, and causing a sufficient compressive strain to exist in each individual unit structure 6.

To be specific, on the first intermediate layer 5 that is the uppermost layer of the unit structure 6, the second intermediate layer 7 made of a group-III nitride whose in-plane lattice constant under the strain-free state is smaller than the group-III nitride of the first intermediate layer 5 is formed. In the second intermediate layer 7 provided in this manner, a misfit dislocation caused by a difference in the lattice constant from the first intermediate layer 5 exists in the vicinity of an interface with the first intermediate layer 5, but a lattice relaxation occurs at least in the vicinity of the surface thereof, to achieve a substantially strain-free state in which no tensile stress acts. Here, being substantially strain-free means that at least a portion other than the vicinity of the interface with the first intermediate layer 5 immediately below has the substantially same lattice constant as the lattice constant under the bulk state.

In the unit structure 6 formed on such a substantially strain-free second intermediate layer 7, no tensile stress acts on the first unit layer 31 that is the lowermost layer of this unit structure 6. Therefore, this unit structure 6 is also formed in such a manner that a compressive strain suitably exists therein, similarly to the unit structure 6 immediately below the second intermediate layer 7.

Preferably, both the first unit layer 31 and the second intermediate layer 7 are made of AlN. In this case, by continuously forming the second intermediate layer 7 and the first unit layer 31, both of them are configured as substantially one layer. This can more surely prevent a tensile stress from acting on the first unit layer 31.

In a case where the thickness of the second intermediate layer 7 is too small, similarly to a case where the first unit layer 31 is formed directly on the first intermediate layer 5, a tensile stress acts on the second intermediate layer 7. The composition modulation layer 3 is formed under an influence thereof. As a result, a compressive strain does not suitably exist in the composition modulation layer 3. Thus, too small a thickness is not preferable. On the other hand, in a case where the thickness of the second intermediate layer 7 is too large, an influence of a difference in the thermal expansion coefficient between the second intermediate layer 7 itself and silicon of the base substrate 1 is not negligible, and a tensile stress caused by the difference in the thermal expansion coefficient acts on the second intermediate layer 7. Thus, too large a thickness is not preferable. Forming the second intermediate layer 7 with a thickness of roughly 15 nm or more and 150 nm or less as described above is a suitable requirement for enabling the second intermediate layer 7 to be formed in a substantially strain-free state so that no tensile stress acts on the first unit layer 31 immediately above.

In a case of providing more unit structures 6, the second intermediate layer 7 is interposed between one of the unit structures 6 in the same manner as described above, to thereby achieve a state where a compressive strain suitably exists in all the unit structures 6. Under the condition that the unit structures 6 have the same configuration, the compressive strain existing in the buffer layer 8 becomes large as the number of repetition of lamination of the unit structure 6.

In the epitaxial substrate 10 including the buffer layer 8 configured in the above-described manner, due to the large compressive strain existing in the buffer layer 8, a state is achieved in which a tensile stress caused by a difference in the thermal expansion coefficient between silicon and the group-III nitride is suitably cancelled. Thereby, the epitaxial substrate 10 can be made crack-free. Additionally, due to the cancellation of the tensile stress, the amount of warping in the epitaxial substrate 10 is suppressed to 100 μm or less.

That is, in the epitaxial substrate 10 according to this embodiment, the buffer layer 8 is provided by alternately laminating the unit structure 6, in which the termination layer 4 and the first intermediate layer 5 serving as a strain reinforcing layer are formed on the composition modulation layer 3 serving as a strain introduction layer, and the substantially strain-free second intermediate layer 7. This causes a large compressive strain to exist in the buffer layer 8, to suitably reduce a tensile stress caused in the epitaxial substrate 10 due to the difference in the thermal expansion coefficient between silicon and the group-III nitride. As a result, in the epitaxial substrate 10, a crack-free state is achieved and warping is reduced.

Since the buffer layer 8 is formed on the second base layer 2b in which an accumulation of strain energy is suppressed as described above, the effect of canceling the tensile stress is not hindered by any strain energy accumulated in the second base layer 2b.

Moreover, repeatedly laminating the unit structure 6 and the second intermediate layer 7 increases the total film thickness of the epitaxial film itself. In general, in a case where a HEMT device is prepared using the epitaxial substrate 10, as the total film thickness thereof increases, the breakdown voltage of the HEMT device becomes higher. Thus, the configuration of the epitaxial substrate 10 according to this embodiment also contributes to increase of the breakdown voltage.

<Increase of Breakdown Voltage of Epitaxial Substrate>

In this embodiment, by varying configuration parameters of the buffer layer 8 (such as the composition and the thickness of each layer, the number of pair layers in the composition modulation layer 3, and the number of repetition of lamination of the unit structures 6), various epitaxial substrates 10 having different specific configurations are obtained.

Particularly, by forming the second unit layer 32 with a group-R1 nitride having a composition of $Al_xGa_{1-x}N$ ($0.1 \leq x \leq 0.25$) and forming the first intermediate layer 5 with a group-III nitride having a composition of $Al_yGa_{1-y}N$ ($0.1 \leq y \leq 0.25$), the epitaxial substrate 10 that is crack-free and has a high breakdown voltage is achieved. In this embodiment, the breakdown voltage means a voltage value at which a leakage current of 1 mA/cm$^2$ occurs in a case where the voltage is applied to the epitaxial substrate 10 while being increased from 0V.

In such a case, if the thickness and the number of laminations of each layer are identical, there is a tendency that the breakdown voltage increases as the Al mole fraction (corresponding to x and y mentioned above) in the second unit layer 32 and the first intermediate layer 5 becomes higher within the above-mentioned composition range.

If the composition of each layer is identical, there is a tendency that the breakdown voltage increases as the sum of the film thickness of the second unit layer 32 and the film thickness of the first intermediate layer 5. For example, in a case where the buffer layer 8 is formed such that the total film thickness of the entire epitaxial film except the base substrate 1 can be 4.0 μm or less while the total film thickness of the second unit layer 32 and the first intermediate layer 5 can be 1700 nm or more, a high breakdown voltage of 600V or higher is achieved. If the number of repetition of lamination of the unit structures 6, the total film thickness of the entire epitaxial film, and the total film thickness of the second unit layer 32 and the first intermediate layer 5 are appropriately set, the epitaxial substrate 10 having a higher breakdown voltage can be obtained. For example, an epitaxial substrate in which the total film thickness of the entire epitaxial film is 5 μm and the breakdown voltage is 1000V or higher, and an epitaxial substrate in which the total film thickness of the entire epitaxial film is 7 μm and the breakdown voltage is 1400V or higher, can be achieved.

Additionally, in a case where the thickness of the termination layer 4 is greater than the thickness of the first unit layer 31, an epitaxial substrate in which the breakdown voltage is high and warping is suitably suppressed is achieved.

If the composition and the film thickness of each layer is identical, there is a tendency that when the number of repetition of lamination of the unit structures 6 is too large, the breakdown voltage is rather lowered. The reason therefor is considered as follows. As the number of repetition of lamination of the unit structures 6 becomes larger, the sum of the film thickness of the second unit layer 32 and the film thickness of the first intermediate layer 5 increases, and on the other hand, the number of second intermediate layers 7 provided between the unit structures 6 also increases. Therefore, due to an influence of the misfit dislocation existing in the second intermediate layer 7, a leakage current tends to increase. Specifically, it is preferable that the number of repetition of lamination is about 3 to 4.

As described above, in this embodiment, the buffer layer formed by alternately laminating the unit structure, which includes the composition modulation layer, the termination layer, and the first intermediate layer and has a compressive strain contained therein, and the substantially strain-free second intermediate layer is interposed between the base substrate and the function layer. Accordingly, a crack-free epitaxial substrate having an excellent crystal quality can be obtained in which a silicon substrate, which is easily available in a large diameter at a low cost, is adopted as a base substrate thereof. In this epitaxial substrate, the amount of warping is suppressed to 100 μm or less.

Moreover, when the second unit layer and the first intermediate layer are made of AlGaN having an Al mole fraction of 0.1 or more and 0.25 or less, an epitaxial substrate that is crack-free and has a high breakdown voltage is achieved.

<Modification>

In the epitaxial substrate 10, an interface layer (not shown) may be provided between the base substrate 1 and the first base layer 2a. In one preferable example, the interface layer has a thickness of about several nm and is made of amorphous $SiAl_uO_vN_w$.

In a case where an interface layer is provided between the base substrate 1 and the first base layer 2a, a lattice misfit between the base substrate 1 and the second base layer 2b, and the like, is more effectively relieved, and the crystal quality of each layer formed thereon is further improved. That is, in a case where an interface layer is provided, an AlN layer that is the first base layer 2a is formed such that the AlN layer can obtain a concavo-convex shape similar to a case where no interface layer is provided and such that the amount of crystal grain boundaries existing therein can be reduced as compared with the case where no interface layer is provided. Particularly, the first base layer 2a having improvement in the half width value of the (0002) X-ray rocking curve is obtained. This is because, in a case where the first base layer 2a is formed on the interface layer, nucleus formation of AlN, which will make the first base layer 2a, is less likely to progress than in a case where the first base layer 2a is formed directly on the base substrate 1, and consequently the growth in the horizontal direction is promoted as compared with when no interface layer is provided. The film thickness of the interface layer is to an extent not exceeding 5 nm. When such an interface layer is provided; the first base layer 2a can be formed such that the half width of the (0002) X-ray rocking curve can be in a range of 0.5 degrees or more and 0.8 degrees or less. In this case, the function layer 9 can be formed with a more excellent crystal quality in which the half width of the (0002) X-ray rocking curve is 800 sec or less and the screw dislocation density is $1 \times 10^9$/cm$^2$ or less.

The formation of the interface layer is achieved by, after the silicon wafer reaches the first base layer formation temperature and before the first base layer 2a is formed, introducing an only TMA bubbling gas into the reactor to expose the wafer to an TMA bubbling gas atmosphere.

Furthermore, in the formation of the first base layer 2a, at least one of Si atoms and O atoms may diffuse and form a solid solution in the first base layer 2a, or at least one of N atoms and O atoms may diffuse and form a solid solution in the base substrate 1.

EXAMPLES

In examples, a plurality of kinds of epitaxial substrates 10 were prepared which were different from one another in terms of a layer configuration of the buffer layer 8. A basic configuration of the epitaxial substrate 10 according to the example, and more specifically, the material and the film thickness of each layer, are shown in Table 1.

As shown in Table 1, in this example, each of the base substrate 1, the base layer 2 (the first base layer 2a and the second base layer 2b), and the function layer 9 was formed of the same material and with the same film thickness for all the epitaxial substrates 10. The function layer 9 had a two-layer configuration of a channel layer and a barrier layer.

Any of the first unit layer 31, the termination layer 4, and the second intermediate layer 7 was made of AlN, but a combination of film thicknesses thereof was varied depending on specimens. In Table 1, the film thickness of the first unit layer 31 is represented as the variable A (nm), the film thickness of the termination layer 4 is represented as the variable C (nm), and the film thickness of the second intermediate layer 7 is represented as the variable E (nm). In the same manner, the film thickness of the second unit layer 32 is represented as the variable B (nm), and the film thickness of the first intermediate layer 5 is represented as the variable D (nm). n represents the number of layers of the first unit layer 31 and the second unit layer 32. K represents the number of repetitions of the unit structures 6.

TABLE 1

| | Name | | Material | Film Thickness | | |
|---|---|---|---|---|---|---|
| Function layer | Barrier layer | | $Al_{0.2}Ga_{0.8}N$ | 25 nm | | Repeated K times |
| | Channel layer | | GaN | 700 nm | | |
| Unit structure | First intermediate layer | | $Al_yGa_{1-y}N$ | D nm | | |
| | Termination layer | | AlN | C nm | | |
| | Composition modulation layer | Second unit layer | $Al_xGa_{1-x}N$ | B nm | $(A+B) \times n$ | |
| | | First unit layer | AlN | A nm | | |
| | Second intermediate layer | | AlN | E nm | | |
| Unit structure | First intermediate layer | | $Al_yGa_{1-y}N$ | D nm | | |
| | Termination layer | | AlN | C nm | | |
| | Composition modulation layer | Second unit layer | $Al_xGa_{1-x}N$ | B nm | $(A+B) \times n$ | |
| | | First unit layer | AlN | A nm | | |
| | ... | | | | | |
| Unit structure | First intermediate layer | | $Al_yGa_{1-y}N$ | D nm | | |
| | Termination layer | | AlN | C nm | | |
| | Composition modulation layer | Second unit layer | $Al_xGa_{1-x}N$ | B nm | $(A+B) \times n$ | |
| | | First unit layer | AlN | A nm | | |
| | Second intermediate layer | | AlN | E nm | | |
| Unit structure | First intermediate layer | | $Al_yGa_{1-y}N$ | D nm | | |
| | Termination layer | | AlN | C nm | | |
| | Composition modulation layer | Second unit layer | $Al_xGa_{1-x}N$ | B nm | $(A+B) \times n$ | |
| | | First unit layer | AlN | A nm | | |
| | Second base layer/First base layer | | $Al_{0.1}Ga_{0.9}N$/AlN | 140 nm | | |
| | Base substrate | | Si(111) | 525 nm | | |

Example 1

In this example, the values of D, E, n, and K were variously changed and thereby 27 kinds of epitaxial substrates 10 (specimens a-1 to a-27) were prepared which were different from one another in terms of the configuration of the buffer layer 8. Then, the presence or absence of occurrence of cracking was evaluated, and the amount of warping was measured. In any specimen, A=C=5 nm and B=15 nm. FIG. 4 is a diagram showing a list of the configuration of each layer, the presence or absence of occurrence of cracking, and the amount of warping, with respect to each epitaxial substrate 10.

Until the formation of the second base layer 2b, the same procedure was performed for any of the specimens. A (111) plane single crystal silicon wafer (hereinafter, a silicon wafer) of 4 inch having a p-type conductivity and having a substrate thickness of 525 μm was prepared as the base substrate 1. The prepared silicon wafer was subjected to dilute hydrofluoric acid cleaning using dilute hydrofluoric acid having a composition of hydrofluoric-acid/pure-water=1/10 (volume ratio), and to SPM cleaning using cleaning liquid having a composition of sulfuric-acid/aqueous-hydrogen-peroxide=1/1 (volume ratio). Thus, a state was created in which an oxide film having a thickness of several Å was formed on the wafer surface, which was then set in a reactor of a MOCVD apparatus. Then, a hydrogen/nitrogen mixed atmosphere was created in the reactor, and the pressure in the reactor was set to be 15 kPa. Heating was performed until the substrate temperature reached 1100° C. that is the first base layer formation temperature.

When the substrate temperature reached 1100° C., a $NH_3$ gas was introduced into the reactor, and the substrate surface was exposed to a $NH_3$ gas atmosphere for one minute.

Then, a TMA bubbling gas was introduced into the reactor with a predetermined flow ratio, to react $NH_3$ with TMA, so that the first base layer 2a whose surface has a three-dimensional concavo-convex shape was formed. At this time, the growing speed (film formation speed) of the first base layer 2a was set to be 20 nm/min, and the target average film thickness of the first base layer 2a was set to be 100 nm.

After the first base layer 2a was formed, then the substrate temperature was set to be 1100° C. and the pressure in the reactor was set to be 15 kPa. A TMG bubbling gas was further introduced into the reactor, to react $NH_3$ with TMA and TMG, so that an $Al_{0.1}Ga_{0.9}N$ layer serving as the second base layer 2b was formed so as to have an average film thickness of about 40 nm.

Subsequent to the formation of the second base layer 2b, the buffer layer 8 was formed. In this example, as shown in FIG. 4, in any specimen, the first unit layer 31 and the second intermediate layer 7 were entirely made of AlN. The second unit layer 32 and the first intermediate layer 5 were entirely made of GaN. However, only in the specimen a-21, a single unit structure 6 was formed and no second intermediate layer 7 was formed. In the formation of a composition modulation layer, the substrate temperature was set to be 1100° C., and the pressure in the reactor was set to be 15 kPa. The same material gas as for the formation of the base layer 2 was used.

In any specimen, after the buffer layer 8 was formed, the channel layer made of GaN was formed with a thickness of 700 nm and the barrier layer was formed with 25 nm to form the functional layer 9. In the formation of the function layer 9, the substrate temperature was set to be 1100° C., and the pressure in the reactor was set to be 15 kPa. In any of the formations, the same material gas as for the formation of the base layer 2 was used.

Through the above-described process, an epitaxial substrate was obtained. For the obtained epitaxial substrate, the presence or absence of occurrence of cracking was checked. Additionally, the amount of warping was measured using a laser displacement gauge.

As shown in FIG. 4, no cracking occurred in the specimens a-1 to a-20 while cracking occurred at 20 mm from the outer periphery in the specimens a-21 to a-27, even though the total film thicknesses of the epitaxial films formed on the base substrates 1 were similar to one another.

Comparing a-1 to a-20 with a-21, the number of repetitions of the unit structures 6 in the former was three or more while the number of repetitions of the unit structures 6 in the latter was only one, and moreover, the latter included no second intermediate layer 7. This result indicates that alternately and repeatedly laminating the unit structures 6 and the second intermediate layers 7 is effective in achieving a crack-free state of the epitaxial substrate 10.

Comparing a-1 to a-20 with a-22 and a-23, the first intermediate layer 5 of the former had a thickness of 100 nm or more and 500 nm or less, while the first intermediate layer 5 of the latter had a thickness of 80 nm which is less than 100 nm. This result indicates that forming the first intermediate layer 5 with a thickness of 100 nm or more and 500 nm or less is effective in achieving a crack-free state of the epitaxial substrate 10.

Comparing a-1 to a-20 with a-24 to a-27, the second intermediate layer 7 of the former had a thickness of 15 nm or more and 150 nm or less, while the second intermediate layer 7 of the latter had a thickness of less than 15 nm or more than 150 nm. This result indicates that forming the second intermediate layer 7 with a thickness of 15 nm or more and 150 nm or less is effective in achieving a crack-free state of the epitaxial substrate 10.

Focusing on the amount of warping in the epitaxial substrate 10, in the specimens a-21 to a-27 in which cracking occurred, the amount of warping exceeded 100 pan, while in the specimens a-1 to a-20 in which no cracking occurred, the amount of warping was suppressed to about 70 μm or less which is far below 100 μm. This result indicates that in the epitaxial substrate 10 according to the above-described embodiment, not only a crack-free state but also suppression of warping is achieved.

Example 2

In this example, the values of x, y, D, E, n, and K were variously changed and thereby 32 kinds of epitaxial substrates 10 (specimens b-1 to b-35) in which the second unit layer 32 and the first intermediate layer 5 contained Al were prepared in the same procedure as in the example 1. Then, the presence or absence of occurrence of cracking was evaluated, the amount of warping was measured, and the breakdown voltage was measured. In any specimen, A=C=5 nm and B=15 nm.

FIG. 5 is a diagram showing a list of the configuration of each layer, the presence or absence of occurrence of cracking, the amount of warping, and the breakdown voltage, with respect to each epitaxial substrate 10. In FIG. 5, for comparison, the layer configurations and the evaluation results with respect to the specimens a-7 to a-9 of the example 1 in which the Al mole fraction is zero are also shown.

As shown in FIG. 5, no cracking occurred in the specimens b-1 to b-33 while cracking occurred at 20 mm from the outer periphery in the specimens b-34 and b-35, even though the total film thicknesses of the epitaxial films formed on the base substrates 1 were similar to one another. It is considered that this is because the thickness of the second intermediate layer 7 was small, similarly to the case of example 1. With respect to the specimens b-34 and b-35 in which the cracking occurred, the evaluation of the breakdown voltage could not be performed.

Focusing on the amount of warping in the epitaxial substrate 10, in the specimens b-34 and b-35 in which cracking occurred, the amount of warping exceeded 100 while in the specimens b-1 to b-33 in which no cracking occurred, the amount of warping was below 100 μm. Similarly to the example 1, this result also indicates that in the epitaxial substrate 10 according to the above-described embodiment, not only a crack-free state but also suppression of warping is achieved.

FIG. 6 is a diagram plotting the breakdown voltage against the total thickness of an AlGaN layer, based on the evaluation results of the specimens a-7 to a-9 and the specimens b-1 to b-33 in which no cracking occurred. In FIG. 6, "TOTAL THICKNESS OF AlGaN LAYER" represented by the horizontal axis indicates the sum of the film thicknesses of the second unit layer 32 of the composition modulation layer 3 and the first intermediate layer 5. The parameter "x_Al" indicates the Al mole fraction (corresponding to x and y mentioned above) in the second unit layer 32 and the first intermediate layer 5. That is, in FIG. 6, the second unit layer 32 and the first intermediate layer 5 have the same composition. The phrase "REPEATED FOUR TIMES", for example, indicates the value of the number K of repetitions of the unit structures 6 in the buffer layer 8.

As shown in FIG. 6, in a case of x_Al=0.0, that is, in a case where the second unit layer 32 and the first intermediate layer 5 are made of GaN (specimen a-7 to a-9), a generally low breakdown voltage of about 100V or lower was obtained, while in a case of 0.1≦x_Al (specimens b-1 to b-33), a high breakdown voltage of about 550V was obtained. This result indicates that increase of the breakdown voltage of the epitaxial substrate 10 is achieved by forming the second unit layer 32 and the first intermediate layer 5 such that the Al mole fraction can be 0.1 or more and 0.25 or less. Moreover, there is a tendency that the breakdown voltage increases as the total thickness of the AlGaN layer is larger and as the Al mole fraction is higher. However, there is a tendency that the breakdown voltage decreases as the number of repetition of lamination of the unit structures 6 is larger.

Depending on the number of pair layers provided in the composition modulation layer 3 and the number of repetition of lamination of the unit structures 6, the total thickness of the AlGaN layer may take various values. However, FIG. 6 indicates that as long as the total thickness of the AlGaN layer is about 1700 nm or more, a breakdown voltage of 600V or higher is obtained irrespective of the number of pair layers and the number of repetition of lamination.

Example 3

In this example, 16 kinds of epitaxial substrates 10 (specimens c-1 to c-16) in which the thickness of the termination layer 4 is larger than the thickness of the first unit layer 31 were prepared in the same procedure as in the example 1. Then, the presence or absence of occurrence of cracking was evaluated, the amount of warping was measured, and the breakdown voltage was measured. In any specimen, A=C=5 nm and B=15 nm.

FIG. 7 is a diagram showing a list of the configuration of each layer, the presence or absence of occurrence of cracking, the amount of warping, and the breakdown voltage, with respect to each epitaxial substrate 10.

As shown in FIG. 7, occurrence of cracking was not observed in all the specimens c-1 to c-16. In any specimen, the amount of warping was suppressed to about 70 μm or less which is far below 100 μm. Additionally, comparing results shown in FIG. 7 with the results shown in FIG. 5 that are for the specimens having the same configuration except the thickness of the termination layer 4, the reduction of the amount of warping is greater in the specimens of this example. This result indicates that the epitaxial substrate 10 having a greater reduction in the amount of warping is achieved by forming the termination layer 4 thicker than the first unit layer 31.

Example 4

An epitaxial substrate 10 (specimen d) was prepared having the same configuration as that of the specimen b-19 except that, in the uppermost unit structure 6 of the buffer layer 8, the number of repetition of lamination of the pair layer in the composition modulation layer 3 was ten. The presence or absence of cracking was evaluated, and the breakdown voltage was measured. Consequently, no cracking was observed in the specimen d, and the breakdown voltage was 810V.

Example 5

An epitaxial substrate 10 (specimen e) was prepared having the same configuration as that of the specimen b-19 except that the thickness of the uppermost second intermediate layer 7 of the buffer layer 8 was set to be 30 nm. The presence or absence of cracking was evaluated, and the breakdown voltage was measured. Consequently, no cracking was observed in the specimen e, and the breakdown voltage was 790V.

Example 6

Four epitaxial substrates (specimens f-1 to f-4) were prepared having the same configuration as that of the specimen b-19 except that the number of repetition of lamination of the unit structures 6 was five and that the thickness of the second intermediate layer 7 was variously changed corresponding to four second intermediate layers. The presence or absence of cracking was evaluated, and the breakdown voltage was measured.

With respect to the specimens f-1 to f-4, the film thickness of the second intermediate layer 7 and the breakdown voltage were as follows. The film thickness (unit: nm) of the second intermediate layer 7 is shown in order from the film thickness of the lowermost second intermediate layer 7.

specimen f-1: 40, 50, 60, 70; breakdown voltage 795V
specimen f-2: 40, 60, 60, 80; breakdown voltage 800V
specimen f-3: 40, 60, 60, 60; breakdown voltage 805V
specimen f-4: 50, 55, 60, 80; breakdown voltage 800V
In any specimen, no cracking was observed.

The results of the examples 4 and 6 indicate that the epitaxial substrate 10 having a high breakdown voltage is achieved in various configurations when the second unit layer 32 and the first intermediate layer 5 are formed such that the Al mole fraction is 0.1 or more and 0.25 or less and the second intermediate layer 7 is formed with a thickness of 15 nm or more and 150 nm or less.

The invention claimed is:
1. An epitaxial substrate in which a group of group-III nitride layers are formed on a base substrate made of (111)-oriented single crystal silicon such that a (0001) crystal plane of said group of group-III nitride layers is substantially in parallel with a substrate surface of said base substrate, said epitaxial substrate comprising:
- a buffer layer formed of a first lamination unit and a second lamination unit being alternately laminated such that each of an uppermost portion and a lowermost portion of said buffer layer is formed of said first lamination unit; and
- a crystal layer formed on said buffer layer, wherein
said first lamination unit includes:
- a composition modulation layer formed of a first unit layer and a second unit layer having different compositions being alternately and repeatedly laminated so that a compressive strain exists therein; and
- a first intermediate layer for enhancing said compressive strain existing in said composition modulation layer,
said second lamination unit is a second intermediate layer that is substantially strain-free.

2. The epitaxial substrate according to claim 1, wherein
a first group-III nitride of said first unit layer has an in-plane lattice constant, under a strain-free state, greater than that of a second group-III nitride of said second unit layer,
each of said second unit layers is formed so as to be in a coherent state relative to said first unit layer.

3. The epitaxial substrate according to claim 1, wherein
said first intermediate layer is made of a third group-III nitride and formed so as to be in a coherent state relative to said composition modulation layer.

4. The epitaxial substrate according to claim 3, wherein
said second intermediate layer is made of a fourth group-III nitride whose in-plane lattice constant under a strain-free state is smaller than that of said third group-III nitride.

5. An epitaxial substrate in which a group of group-III nitride layers are formed on a base substrate made of (111)-oriented single crystal silicon such that a (0001) crystal plane of said group of group-III nitride layers is substantially in parallel with a substrate surface of said base substrate, said epitaxial substrate comprising:
- a buffer layer formed of a first lamination unit and a second lamination unit being alternately laminated such that each of an uppermost portion and a lowermost portion of said buffer layer is formed of said first lamination unit; and
- a crystal layer made of a group-III nitride and formed on said buffer layer, wherein
said first lamination unit includes:
- a composition modulation layer formed of a first unit layer and a second unit layer being alternately and repeatedly laminated, said first unit layer and said second unit layer being made of group-III nitrides having different compositions, a first group-III nitride of said first unit layer having an in-plane lattice constant, under a strain-free state, greater than that of a second group-III nitride of said second unit layer; and
- a first intermediate layer made of a third group-III nitride and formed so as to be in a coherent state relative to said composition modulation layer,
in said composition modulation layer, each of said second unit layers is formed so as to be in a coherent state relative to said first unit layer,
said second lamination unit is a second intermediate layer made of a fourth group-III nitride whose in-plane lattice constant under a strain-free state is smaller than that of said third group-III nitride.

6. The epitaxial substrate according to claim 5, wherein
said first unit layer is made of AlN, and said second unit layer is made of a group-III nitride having a composition of $Al_xGa_{1-x}N$ ($0 \leq x \leq 0.25$).

7. The epitaxial substrate according to claim 6, wherein
said first intermediate layer is made of a group-III nitride having a composition of $Al_yGa_{1-y}N$ ($0 \leq y \leq 0.25$) and formed with a thickness of 100 nm or more and 500 nm or less.

8. The epitaxial substrate according to claim 7, wherein
said second intermediate layer is made of AlN and formed with a thickness of 15 nm or more and 150 nm or less.

9. The epitaxial substrate according to claim 6, wherein
said second unit layer is made of a group-III nitride having a composition of $Al_xGa_{1-x}N$ ($0.1 \leq x \leq 0.25$), and said first intermediate layer is made of a group-III nitride having a composition of $Al_yGa_{1-y}N$ ($0.1 \leq y \leq 0.25$).

10. The epitaxial substrate according to claim 9, wherein
a total film thickness of all layers formed on said base substrate is equal to or smaller than 4.0 μm, and a sum of the film thicknesses of all of said second unit layers and said first intermediate layers is equal to or greater than 1700 nm.

11. The epitaxial substrate according to claim 9, wherein
the composition of said second unit layer is substantially the same as the composition of said first intermediate layer.

12. The epitaxial substrate according to claim 5, wherein
a termination layer having a same composition as that of said first unit layer is provided on an uppermost portion of said composition modulation layer.

13. A method for manufacturing an epitaxial substrate for use in a semiconductor device, said epitaxial substrate having a group of group-III nitride layers formed on a base substrate made of (111)-oriented single crystal silicon such that a (0001) crystal plane of said group of group-III nitride layers is substantially in parallel with a substrate surface of said base substrate, said method comprising:
- a buffer layer formation step for forming a buffer layer by alternately laminating a first lamination unit and a second lamination unit such that each of an uppermost portion and a lowermost portion of said buffer layer is formed of said first lamination unit; and
- a crystal layer formation step for forming a crystal layer above said buffer layer, said crystal layer being made of a group-III nitride, wherein
in said buffer layer formation step, formation of said first lamination unit includes:
- a composition modulation layer formation step for forming a composition modulation layer by alternately and repeatedly laminating a first unit layer and a second unit layer made of group-III nitrides having different compositions; and
- a first intermediate layer formation step for forming a first intermediate layer on said composition modulation layer, in said buffer layer formation step, formation of said second lamination unit includes:
- a second intermediate layer formation step for forming a second intermediate layer on said first intermediate layer, in said composition modulation layer formation step, said composition modulation layer is formed such that:
- a first group-III nitride of said first unit layer has an in-plane lattice constant, under a strain-free state, greater than that of a second group-III nitride of said second unit layer; and
- each of said second unit layers is in a coherent state relative to said first unit layer, in said first intermediate layer formation step, said first intermediate layer is formed of a third group-III nitride so as to be in a coherent state relative to said composition modulation layer, and in said second intermediate layer formation step, said second intermediate layer is formed of a fourth group-III nitride whose in-plane lattice constant under a strain-free state is smaller than that of said third group-III nitride.

14. The method for manufacturing the epitaxial substrate according to claim 13, wherein
said first unit layer is made of AlN, and said second unit layer is made of a group-III nitride having a composition of $Al_xGa_{1-x}N$ ($0 \leq x \leq 0.25$).

15. The method for manufacturing the epitaxial substrate according to claim 14, wherein
said first intermediate layer is made of a group-III nitride having a composition of $Al_yGa_{1-y}N$ ($0 \leq y \leq 0.25$), and formed with a thickness of 100 nm or more and 500 nm or less.

16. The method for manufacturing the epitaxial substrate according to claim 15, wherein
said second intermediate layer is made of AlN and formed with a thickness of 15 nm or more and 150 nm or less.

17. The method for manufacturing the epitaxial substrate according to claim 14, wherein
said second unit layer is made of a group-III nitride having a composition of $Al_xGa_{1-x}N$ ($0.1 \leq x \leq 0.25$), and said first intermediate layer is made of a group-III nitride having a composition of $Al_yGa_{1-y}N$ ($0.1 \leq y \leq 0.25$).

18. The method for manufacturing the epitaxial substrate according to claim 17, wherein
a total film thickness of all layers formed on said base substrate is equal to or smaller than 4.0 μm, and a sum of the film thicknesses of all of said second unit layers and said first intermediate layers is equal to or greater than 1700 nm.

19. The method for manufacturing the epitaxial substrate according to claim 17, wherein
the composition of said second unit layer is substantially the same as the composition of said first intermediate layer.

20. The method for manufacturing the epitaxial substrate according to claim 13, wherein
a formation of said first lamination unit includes a termination layer formation step for forming a termination layer on an uppermost portion of said composition modulation layer, said termination layer having a same composition as that of said first unit layer,
said first intermediate layer is formed on said termination layer.

* * * * *